US010508332B2

(12) United States Patent
Matsuzaki et al.

(10) Patent No.: US 10,508,332 B2
(45) Date of Patent: Dec. 17, 2019

(54) FILM FORMATION APPARATUS, FILM FORMATION METHOD, AND MANUFACTURING METHOD OF SOLAR BATTERY

(71) Applicant: ULVAC, Inc., Chigasaki-shi (JP)

(72) Inventors: Junsuke Matsuzaki, Chigasaki (JP); Hirohisa Takahashi, Chigasaki (JP)

(73) Assignee: ULVAC, INC., Chigasaki-shi (JP)

( * ) Notice: Subject to any disclaimer, the term of this patent is extended or adjusted under 35 U.S.C. 154(b) by 0 days.

(21) Appl. No.: 15/780,886

(22) PCT Filed: Aug. 8, 2017

(86) PCT No.: PCT/JP2017/028711
§ 371 (c)(1),
(2) Date: Jun. 1, 2018

(87) PCT Pub. No.: WO2018/037907
PCT Pub. Date: Mar. 1, 2018

(65) Prior Publication Data
US 2018/0347032 A1    Dec. 6, 2018

(30) Foreign Application Priority Data

Aug. 25, 2016   (JP) .................................. 2016-164441

(51) Int. Cl.
*C23C 14/50*          (2006.01)
*C23C 14/56*          (2006.01)
(Continued)

(52) U.S. Cl.
CPC .......... *C23C 14/505* (2013.01); *C23C 14/042* (2013.01); *C23C 14/3421* (2013.01);
(Continued)

(58) Field of Classification Search
CPC .................................................... C23C 14/50
See application file for complete search history.

(56) References Cited

U.S. PATENT DOCUMENTS

| 4,261,808 A * | 4/1981 | Walter .................. C23C 14/568 |
|---|---|---|
| | | 204/298.25 |
| 2006/0068084 A1* | 3/2006 | Shinozaki ............... C23C 14/50 |
| | | 427/64 |

(Continued)

FOREIGN PATENT DOCUMENTS

| JP | 2001-44461 A | 2/2001 |
|---|---|---|
| JP | 2005-171369 A | 6/2005 |

(Continued)

OTHER PUBLICATIONS

Office Action issued to Korean Patent Application No. 10-2018-7011960, dated Aug. 20, 2018 (6 sheets, 7 sheets translation, 13 sheets total).

(Continued)

*Primary Examiner* — John J Brayton
(74) *Attorney, Agent, or Firm* — Kratz, Quintos & Hanson, LLP

(57) ABSTRACT

The present invention provides a technique for performing film formation at low cost without causing a short-circuit between sputtered films formed on opposite surfaces of a film-formation target substrate. According to the present invention, in a substrate-holder conveyance mechanism 3, a substrate holder 11 is conveyed by a first conveyance portion so that the substrate holder 11 passes through a first film formation region; film formation is performed by sputtering on a first surface of a film-formation target substrate 50 held by the substrate holder 11; the substrate holder 11 is conveyed from the first conveyance portion to a second conveyance portion in such a manner as to make a turn with the up/down orientation of the substrate holder 11 maintained;

(Continued)

the substrate holder 11 is conveyed by the second conveyance portion in a direction opposite to the direction of conveyance by the first conveyance portion so that the substrate holder 11 passes through a second film formation region; and film formation is performed by sputtering on a second surface of the film-formation target substrate 50. The substrate holder 11 has openings 14 and 15 through which first and second surfaces of the film-formation target substrate 50 are exposed, and includes a shield portion 16 for shielding an edge portion of the film-formation target substrate 50 from a film formation material supplied from a second sputtering source.

4 Claims, 19 Drawing Sheets

(51) Int. Cl.
      *H01L 31/0747*    (2012.01)
      *C23C 14/34*    (2006.01)
      *C23C 14/54*    (2006.01)
      *H01L 31/20*    (2006.01)
      *C23C 14/04*    (2006.01)

(52) U.S. Cl.
    CPC .......... *C23C 14/3464* (2013.01); *C23C 14/50* (2013.01); *C23C 14/541* (2013.01); *C23C 14/56* (2013.01); *C23C 14/568* (2013.01); *H01L 31/0747* (2013.01); *H01L 31/202* (2013.01); *H01L 31/206* (2013.01); *Y02E 10/50* (2013.01); *Y02P 70/521* (2015.11)

(56) References Cited

U.S. PATENT DOCUMENTS

2013/0115373 A1*   5/2013   Kim .................. C23C 16/45551
                                                             427/255.5
2014/0073083 A1*   3/2014   Shima ............. H01L 31/022466
                                                             438/96

FOREIGN PATENT DOCUMENTS

| JP | 2008-520525 A | 6/2008 |
| KR | 10-2010-0117236 A | 11/2010 |
| KR | 10-2013-0049080 A | 5/2013 |

OTHER PUBLICATIONS

International Preliminary Report on Patentability for International Application No. PCT/JP2017/028711 dated Mar. 7, 2019 (6 sheets).
International Search Report for International Application No. PCT/JP2017/028711 dated Sep. 26, 2017 (1 Sheet).

* cited by examiner

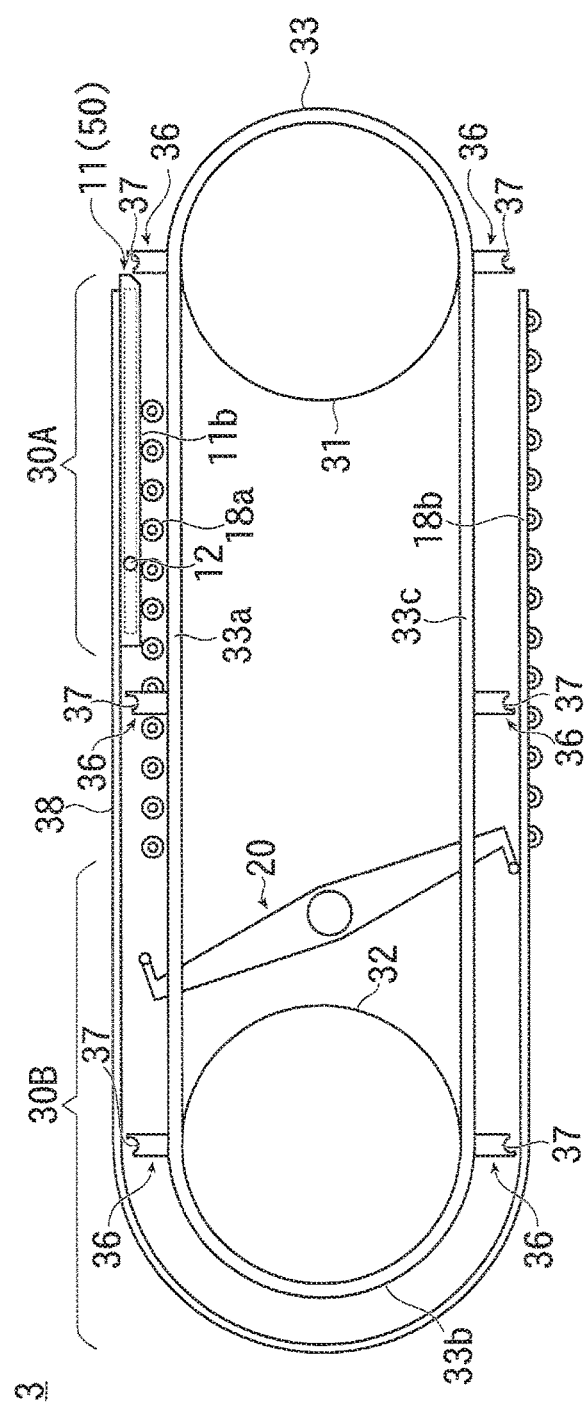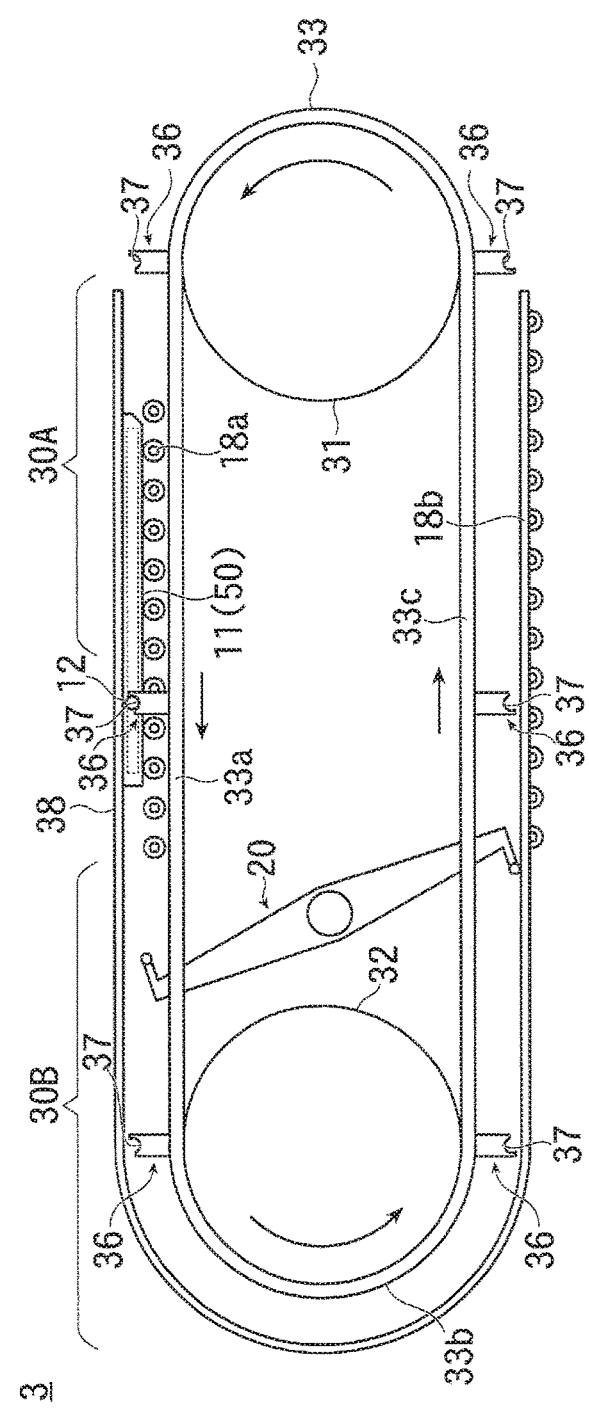
Fig. 9 (a)
Fig. 9 (b)

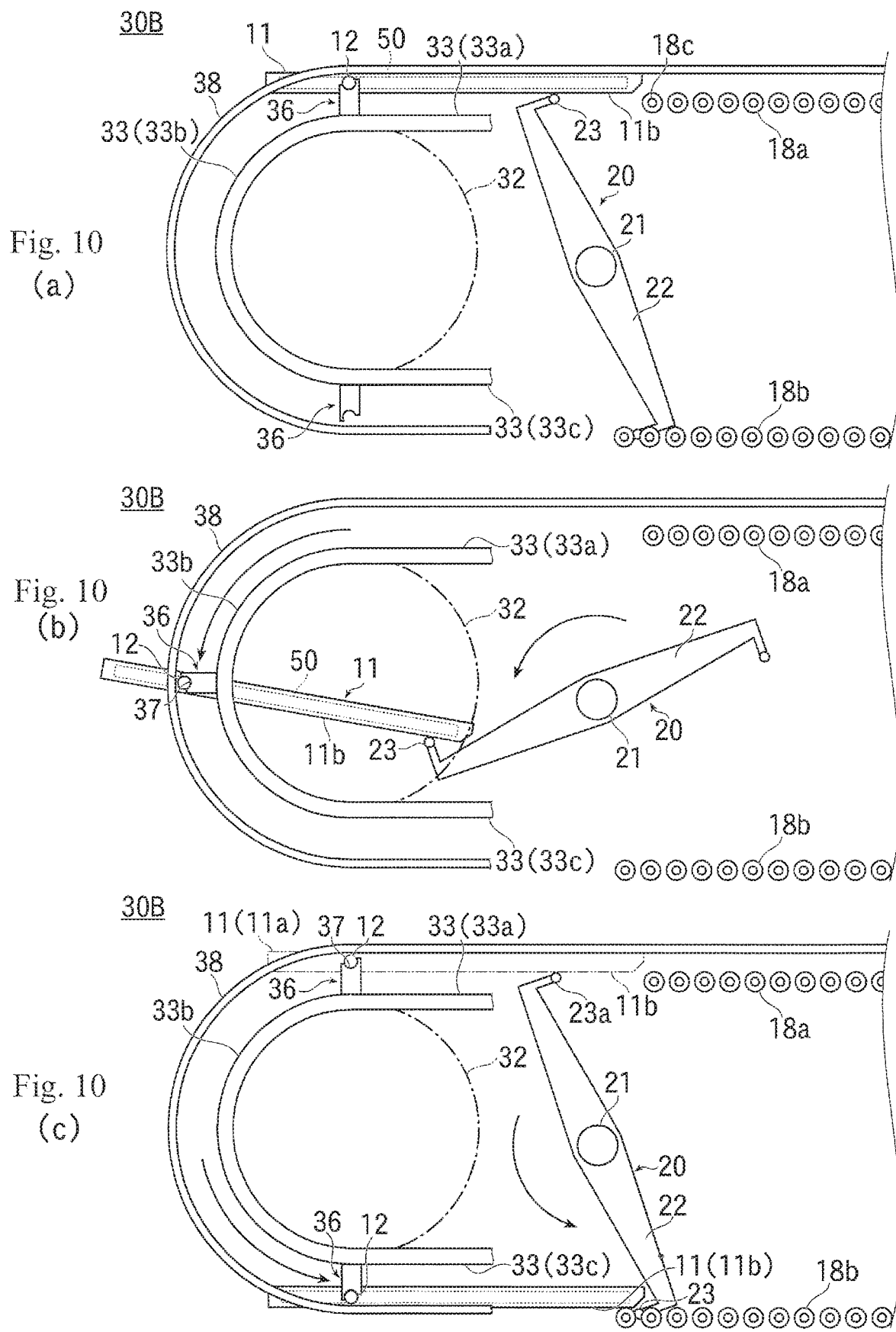

FILM FORMATION APPARATUS, FILM FORMATION METHOD, AND MANUFACTURING METHOD OF SOLAR BATTERY

TECHNICAL FIELD

The present invention relates generally to a technology of a film formation apparatus for forming films on opposite surfaces of a substrate by sputtering in a vacuum, and more specifically, to a technique for forming a transparent conductive oxide layer on each of opposite surfaces of a substrate for a heterojunction solar battery.

BACKGROUND ART

In recent years, solar batteries have been practically used as a clean and safe energy source. Among various types of solar batteries, heterojunction solar batteries are drawing attention.

FIG. 19 is a cross-sectional view illustrating a general configuration of a typical heterojunction solar battery cell.

As illustrated in FIG. 19, the heterojunction solar battery cell 100 is constructed by stacking, on one side (the sunlight side) of an n-type crystalline silicon substrate 101, an i-type amorphous silicon layer 102, a p-type amorphous silicon layer 103, a first transparent conductive oxide layer 104, and an electrode layer 105 in this order, and stacking, on the other side of the substrate 101, an i-type amorphous silicon layer 106, an n-type amorphous silicon layer 107, a second transparent conductive oxide layer 108, and an electrode layer 109 in this order.

Such a heterojunction solar battery is advantageous in that it provides higher efficiency compared with a single crystalline silicon solar battery, and that it reduces the amount of silicon usage by virtue of the use of amorphous silicon layers.

A further advantage of the heterojunction solar battery is its high power generation efficiency due to its capability of generating power on both sides of an n-type crystalline silicon substrate.

A disadvantage, however, of the heterojunction solar battery is its being more complicated in configuration than a single crystalline silicon solar battery, which results in a larger number of processes for its manufacture and higher cost for a manufacturing apparatus for use therein, as well as higher cost for the solar battery itself.

Further, the presence of transparent conductive oxide layers on both sides of the n-type crystalline silicon substrate in the heterojunction solar battery gives rise to another problem described below.

To enhance the conversion efficiency, it is preferable to form a transparent conductive oxide layer over as large an area as possible on an amorphous silicon layer serving as an underlayer; in other words, over the entire surface of the amorphous silicon layer. If, however, transparent conductive oxide layers are formed over the entire surfaces on both sides of the n-type crystalline silicon substrate by sputtering, materials deposited onto the side surfaces of the substrate due to the sputtering may cause a short-circuit between the transparent conductive oxide layers.

Such a problem may be avoided by forming a transparent conductive oxide layer over the entire surface on one side (for example, the sunlight side) of the n-type crystalline silicon substrate while forming another transparent conductive oxide layer on the other side of the substrate over a region other than the edge region of the substrate by performing sputtering using a mask. This, however, necessitates the use of the mask in forming the layer, thus leading to a cost increase.

The above-described problems are encountered not only in forming transparent conductive oxide layers over both surfaces of a film-formation target substrate for a heterojunction solar battery but also in forming various types of sputtered films over both surfaces of a film-formation target substrate.

CITATION LIST

Patent Literature

Patent Literature 1: Japanese Patent Application Laid-Open No. 2001-044461

SUMMARY OF INVENTION

Technical Problem

The present invention has been made in view of the aforementioned problems of the prior art. An object of the present invention is to provide a technique for performing film formation at low cost without causing a short-circuit between sputtered films formed on opposite surfaces of a film-formation target substrate.

Another object of the present invention is to provide a manufacturing technique for a heterojunction solar battery that enhances conversion efficiency at low cost without causing a short-circuit between transparent conductive oxide layers formed on opposite sides of a film-formation target substrate.

Solution to Problem

To achieve the aforementioned objects, a first aspect of the present invention provides a film formation apparatus including: a vacuum chamber in which a single vacuum atmosphere is to be formed; a first film formation region provided in the vacuum chamber and including a first sputtering source for performing film formation on a first surface of a film-formation target substrate; a second film formation region provided in the vacuum chamber and including a second sputtering source for performing film formation on a second surface of the film-formation target substrate; a conveyance path formed to have a single annular shape when projected onto a vertical plane, and provided to pass through the first and second film formation regions; and a substrate-holder conveyance mechanism configured to convey, along the conveyance path, a substrate holder holding a film-formation target substrate in a horizontal position. The substrate-holder conveyance mechanism includes: a first conveyance portion configured to convey the substrate holder in a predetermined direction so that the substrate holder passes through the first film formation region; a second conveyance portion configured to convey the substrate holder in a direction opposite to the direction of conveyance by the first conveyance portion so that the substrate holder passes through the second film formation region; and a turning conveyance portion configured to convey the substrate holder from the first conveyance portion to the second conveyance portion in such a manner as to make a turn while maintaining an up/down orientation of the substrate holder. The substrate holder has openings through which the first and second surfaces of the film-formation target substrate are exposed, and includes a shield portion configured to shield an edge portion of the film-formation target substrate from a film formation material supplied from at least one of the first and second sputtering sources.

In the film formation apparatus of the first aspect of the present invention, the substrate holder may be configured to align a plurality of film-formation target substrates in a direction orthogonal to the conveyance direction and hold the film-formation target substrates.

A second aspect of the present invention provides a film formation method using the film formation apparatus described above. The film formation method includes the steps of: conveying the substrate holder by the first conveyance portion of the substrate-holder conveyance mechanism in a predetermined direction along the conveyance path so that the substrate holder passes through the first film formation region, and performing film formation by sputtering on the first surface of the film-formation target substrate held by the substrate holder; conveying, by the turning conveyance portion of the substrate-holder conveyance mechanism, the substrate holder from the first conveyance portion to the second conveyance portion in such a manner as to make a turn along the conveyance path while maintaining the up/down orientation of the substrate holder; and conveying, by the second conveyance portion of the substrate-holder conveyance mechanism, the substrate holder in the direction opposite to the direction of conveyance by the first conveyance portion along the conveyance path so that the substrate holder passes through the second film formation region, and performing film formation on the second surface of the film-formation target substrate held by the substrate holder.

A third aspect of the present invention provides a manufacturing method of a solar battery using the film formation apparatus described above. The manufacturing method of a solar battery includes the steps of: preparing, as the film-formation target substrate, a substrate composed of: an n-type crystalline silicon substrate; an i-type amorphous silicon layer and a p-type amorphous silicon layer stacked in this order over a first surface of the n-type crystalline silicon substrate; and an i-type amorphous silicon layer and an n-type amorphous silicon layer stacked in this order over a second surface of the n-type crystalline silicon substrate; conveying the substrate holder by the first conveyance portion of the substrate-holder conveyance mechanism in a predetermined direction along the conveyance path so that the substrate holder passes through the first film formation region, and forming a first transparent conductive oxide layer by sputtering on the first surface of the film-formation target substrate held by the substrate holder; conveying, by the turning conveyance portion of the substrate-holder conveyance mechanism, the substrate holder from the first conveyance portion to the second conveyance portion in such a manner as to make a turn along the conveyance path while maintaining the up/down orientation of the substrate holder; and conveying, by the second conveyance portion of the substrate-holder conveyance mechanism, the substrate holder in the direction opposite to the direction of conveyance by the first conveyance portion along the conveyance path so that the substrate holder passes through the second film formation region, and forming a second transparent conductive oxide layer by sputtering on the second surface of the film-formation target substrate held by the substrate holder.

Advantageous Effects of Invention

According to the present invention, the substrate-holder conveyance mechanism is configured so that: the first conveyance portion conveys a substrate holder in a predetermined direction along the conveyance path so that the substrate holder passes through the first film formation region; film formation is performed by sputtering on the first surface of the film-formation target substrate held by the substrate holder; the turning conveyance portion conveys the substrate holder from the first conveyance portion to the second conveyance portion in such a manner as to make a turn along the conveyance path while maintaining the up/down orientation of the substrate holder; the second conveyance portion conveys the substrate holder in a direction opposite to the direction of conveyance by the first conveyance portion along the conveyance path so that the substrate holder passes through the second film formation region; and film formation is performed by sputtering on the second surface of the film-formation target substrate held by the substrate holder.

In this case, the substrate holder used in the present invention has the openings through which the first and second surfaces of the film-formation target substrate are exposed, and includes the shield portion for shielding the edge portion of the film-formation target substrate from a film formation material supplied from at least one of the first and second sputtering sources. When film formation by sputtering is performed on the first and second surfaces of the film-formation target substrate held by the substrate holder at the first and second conveyance portions, respectively, the edge portion of the film-formation target substrate is shielded from a film formation material supplied from at least one of the first and second sputtering sources.

The present invention thus makes it possible to perform, for example, entire-surface film formation on one of the first and second surfaces of the film-formation target substrate while performing film formation on a region of the other surface of the film-formation target substrate other than the edge portion. This enables the prevention, with reliability, of a short-circuit between sputtered films formed on opposite surfaces of the film-formation target substrate.

Furthermore, according to the present invention, the conveyance path is formed to have a single annular shape when projected onto a vertical plane. Along the conveyance path, the substrate holder is conveyed from the first conveyance portion to the second conveyance portion in such a manner as to make a turn, while maintaining the up/down orientation of the substrate holder. The substrate holder is passed through the first and second film formation regions at the first and second conveyance portions, respectively, during which time sputtering is performed. With this compact, passing-type film formation apparatus, it is possible to form a desired sputtered film on each of opposite surfaces of a film-formation target substrate without using a mask. This results in reduced cost.

According to the present invention described above, it is also possible to maximize the area of, for example, the transparent conductive oxide layer on the sunlight side of the film-formation target substrate without causing a short-circuit between transparent conductive oxide layers formed on opposite sides of the substrate. This enables enhancement of the conversion efficiency of a heterojunction solar battery.

Furthermore, according to the present invention, when the substrate holder is configured to align a plurality of film-formation target substrates in a direction orthogonal to the conveyance direction and hold those substrates, the length of the substrate holder and an extra space associated therewith can be smaller compared to the case in which the conventional technique where a substrate holder configured to align a plurality of substrates in the substrate conveyance direction and hold the same is used and conveyed for film formation. This results in space savings for the film formation apparatus.

BRIEF DESCRIPTION OF DRAWINGS

FIG. 4(a) is a plan view illustrating a situation where no substrate is held; FIG. 4(b) is a plan view illustrating a situation where a substrate is held; and FIG. 4(c) is a cross-sectional view taken along line A-A of FIG. 4(a).

FIG. 5(a) is a plan view thereof; and FIG. 5(b) is a cross-sectional view taken along line B-B of FIG. 5(a).

FIGS. 9(a) and 9(b) are explanatory diagrams illustrating an operation of the substrate-holder conveyance mechanism of this embodiment (part 1).

FIGS. 10(a), 10(b) and 10(c) are explanatory diagrams illustrating an operation of the turning conveyance portion of the substrate-holder conveyance mechanism.

DESCRIPTION OF EMBODIMENTS

Figure 1:
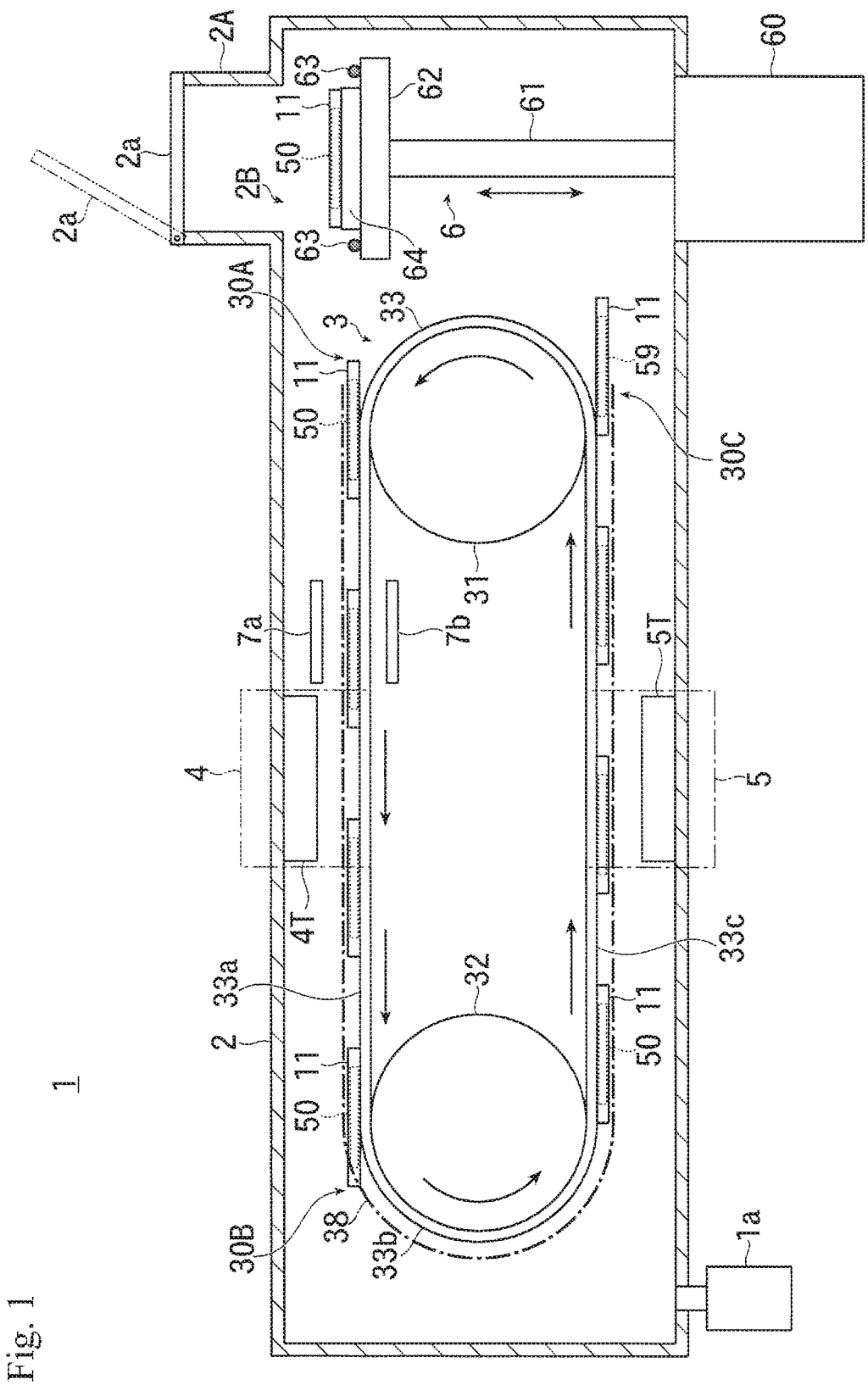
FIG. 1 is a schematic view illustrating an entire configuration of a film formation apparatus according to an embodiment of the present invention.
Figure 2:
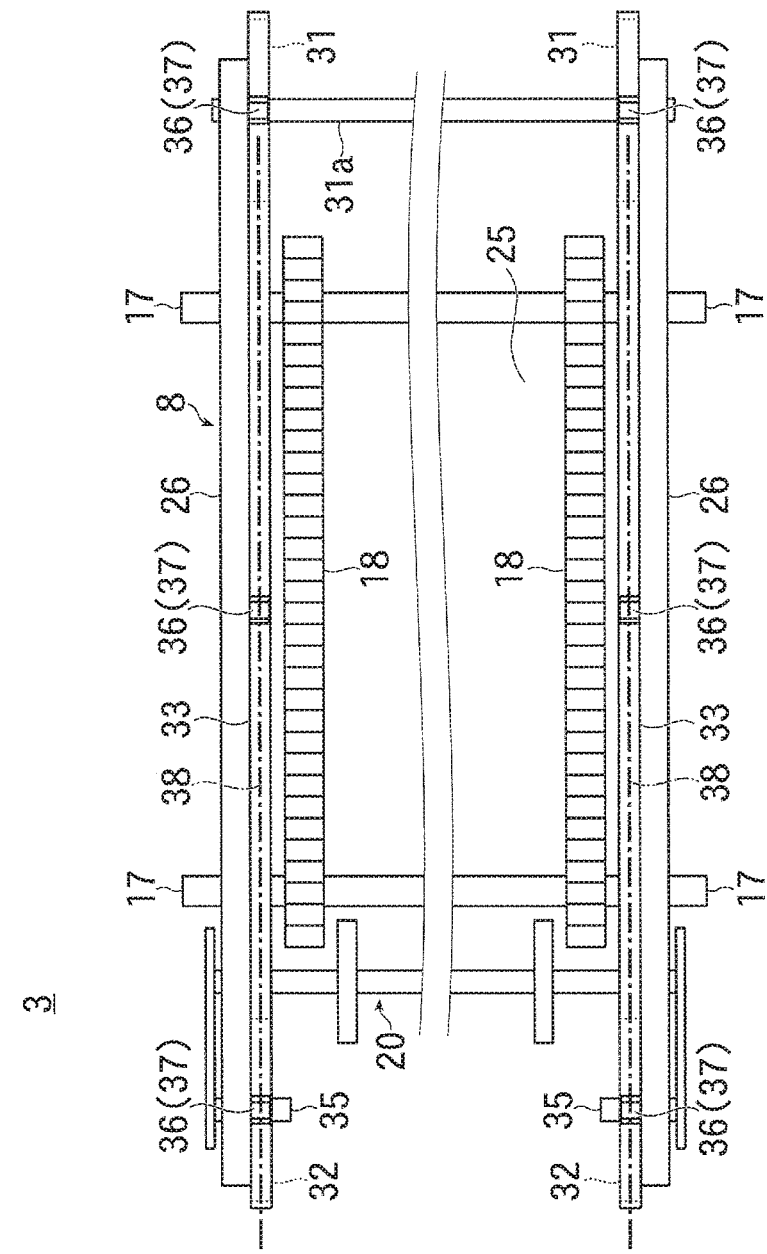
FIG. 2 is a plan view illustrating a general configuration of a substrate-holder conveyance mechanism of this embodiment.
Figure 3:
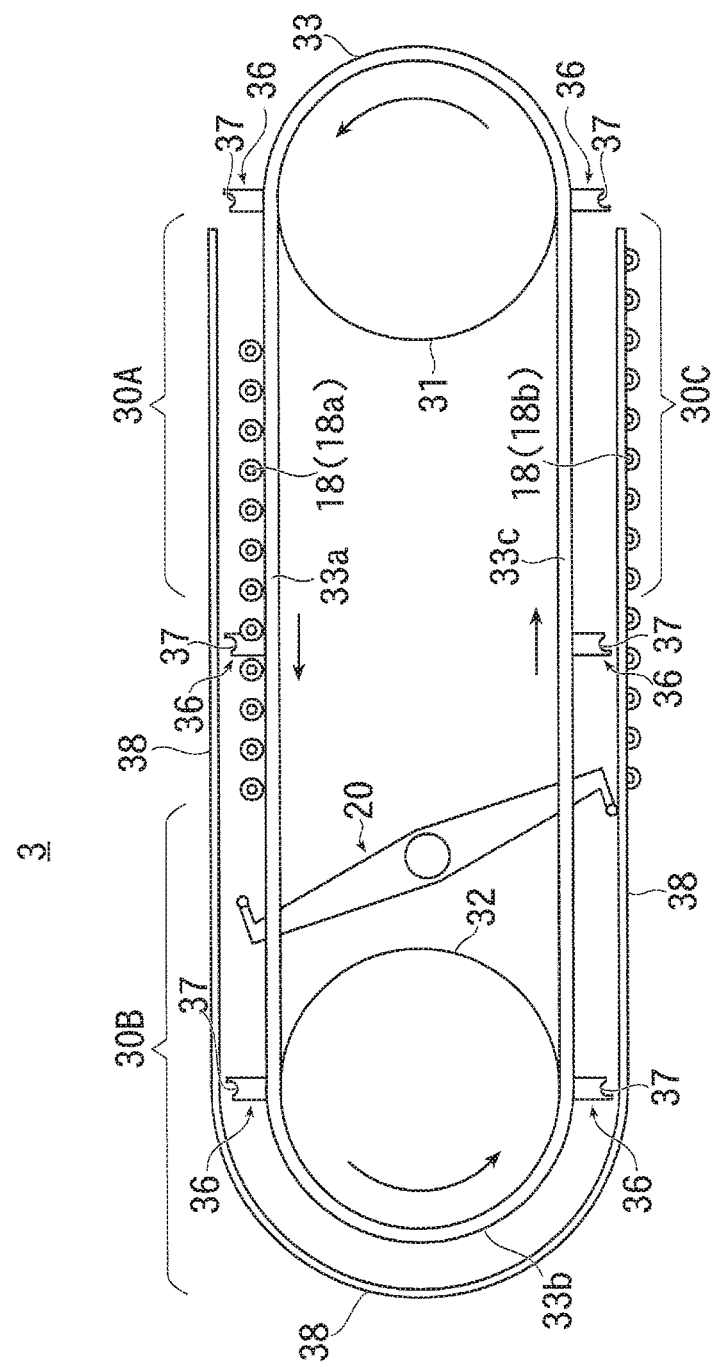
FIG. 3 is a front view illustrating main portions of the substrate-holder conveyance mechanism.

Embodiments of the present invention will be described in detail below with reference to the drawings. FIG. 1 is a schematic view illustrating an entire configuration of a film formation apparatus according to an embodiment the present invention. FIG. 2 is a plan view illustrating a general configuration of a substrate-holder conveyance mechanism of this embodiment. FIG. 3 is a front view illustrating main portions of the substrate-holder conveyance mechanism.

Figure 4:
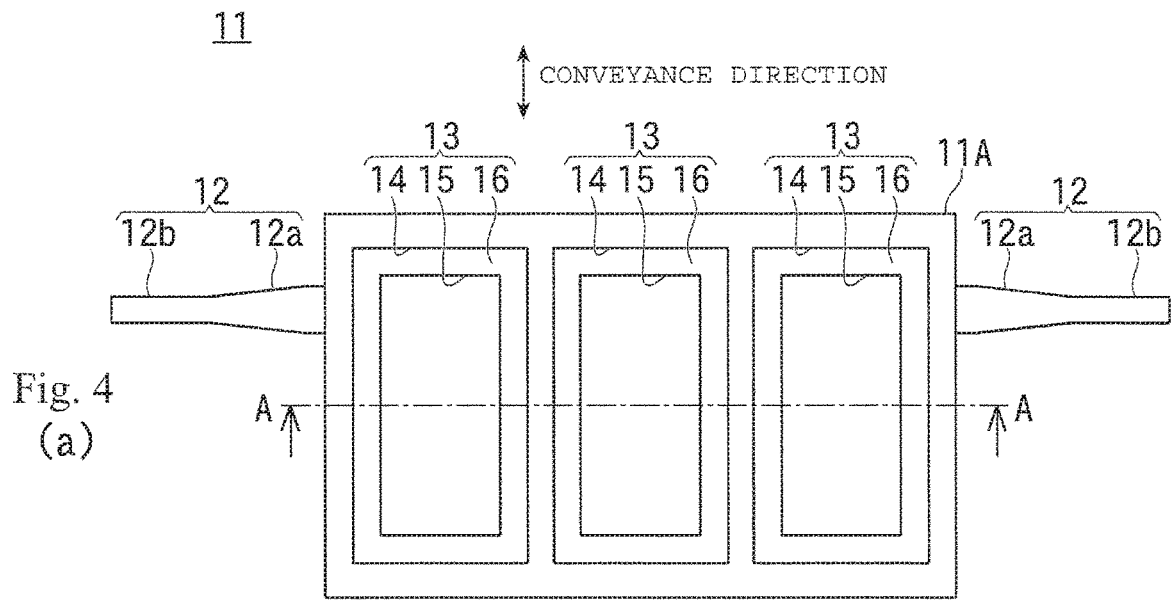
FIGS. 4(a), 4(b) and 4(c) illustrate a configuration of a substrate holder used in this embodiment.
Figure 4:
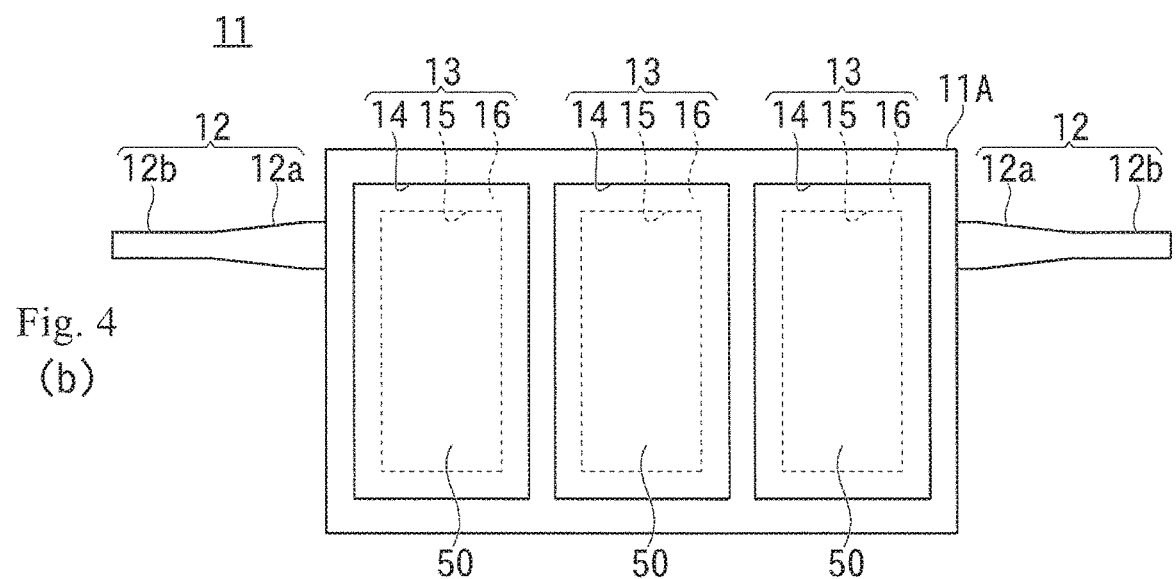
Figure 4:
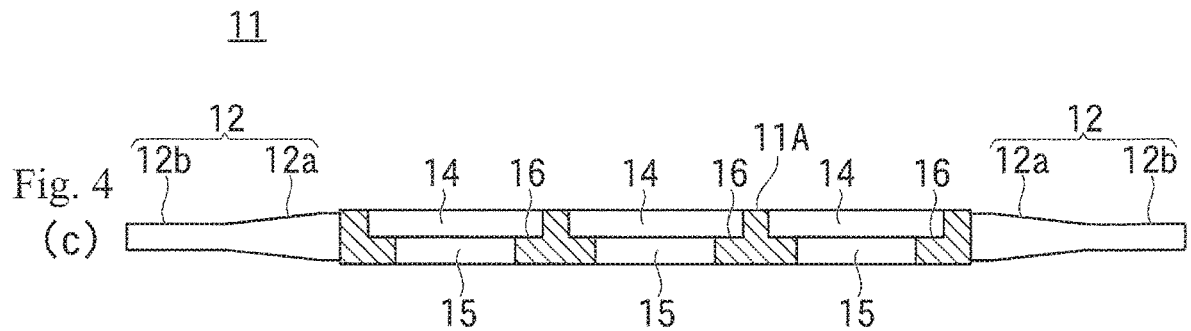

FIGS. 4(a), 4(b) and 4(c) illustrate a configuration of a substrate holder used in this embodiment; FIG. 4(a) is a plan view illustrating a situation where no substrate is held; FIG. 4(b) is a plan view illustrating a situation where a substrate is held; and FIG. 4(c) is a cross-sectional view taken along line A-A of FIG. 4(a).

Figure 5:
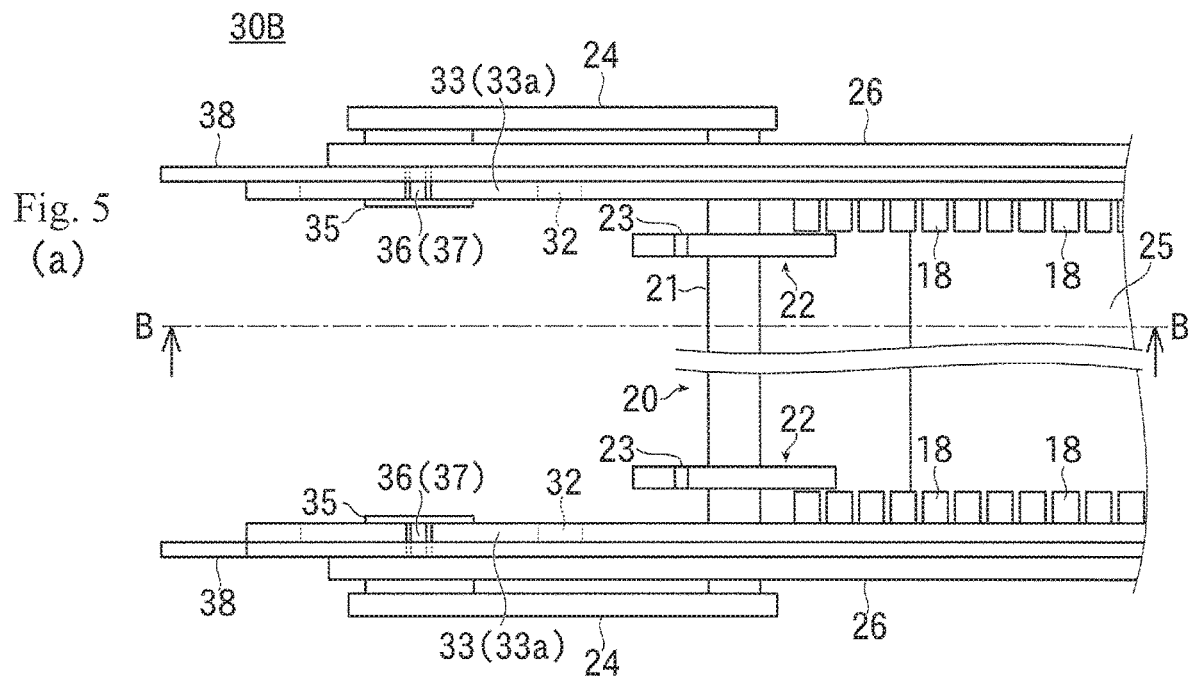
FIGS. 5(a) and 5(b) illustrate a configuration of a turning conveyance portion of the substrate-holder conveyance mechanism of this embodiment.
Figure 5:
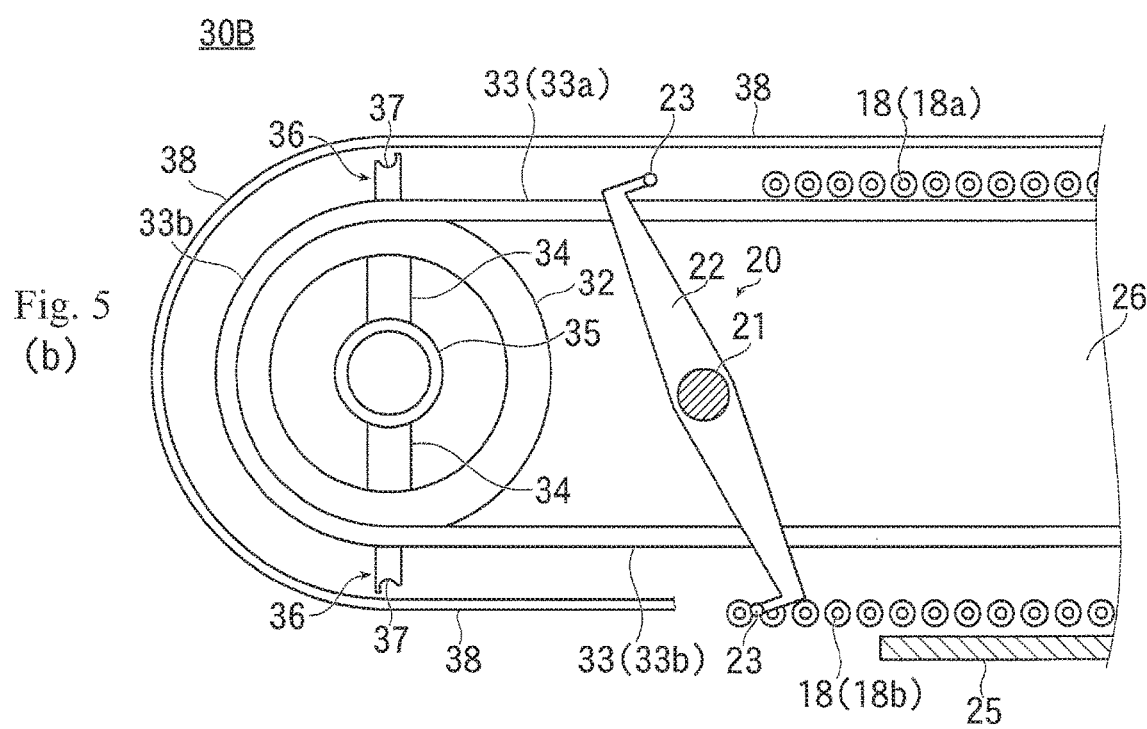

FIGS. 5(a) and 5(b) illustrate a configuration of a turning conveyance portion of the substrate-holder conveyance mechanism of this embodiment; FIG. 5(a) is a plan view thereof; and FIG. 5(b) is a cross-sectional view taken along line B-B of FIG. 5(a).

As illustrated in FIG. 1, a film formation apparatus 1 of this embodiment includes a vacuum chamber 2 in which a single vacuum atmosphere is to be formed, and a vacuum exhaust device 1a for connection with the vacuum chamber 2.

Inside the vacuum chamber 2, there is provided a substrate-holder conveyance mechanism 3 for conveying substrate holders 11, which will be described later, along a conveyance path.

The substrate-holder conveyance mechanism 3 is configured to continuously convey a plurality of substrate holders 11 each of which holds a film-formation target substrate 50.

The substrate-holder conveyance mechanism 3 has first and second drive wheels 31 and 32 of circular shape of identical diameter, each formed of (for example, a sprocket or the like). The first and second drive wheels 31 and 32 are arranged at a predetermined distance from each other with their respective rotation axes horizontal and parallel to each other. Further details of the substrate-holder conveyance mechanism 3 will be described later.

A single continuous conveyance drive member 33 formed of, for example, a chain or the like is placed over the first and second drive wheels 31 and 32, thereby forming a conveyance path that defines a single annular shape on a vertical plane, as more fully described below.

In this embodiment, the first and second drive wheels 31 and 32 are configured to be operated by rotational drive force transmitted from a drive mechanism (not shown).

The conveyance drive member 33 having the conveyance path includes: a forward path-side conveyance portion (a first conveyance portion) 33a, which is an upper portion, configured to move from the first drive wheel 31 toward the second drive wheel 32 to convey the substrate holders 11; a turning portion 33b, which is a portion on the periphery of the second drive wheel 32, configured to turn the conveyance direction of the substrate holders 11 to the opposite direction; and a return path-side conveyance portion (a second conveyance portion) 33c, which is a lower portion, configured to move from the second drive wheel 32 toward the first drive wheel 31.

The substrate-holder conveyance mechanism 3 further includes a substrate-holder introduction portion 30A for introducing the substrate holders 11, a turning conveyance portion 30B for conveying the substrate holders 11 in such a manner as to make a turn, and a substrate-holder ejection portion 30C for ejecting the substrate holders 11.

A guide member 38 for preventing the substrate holders 11 from falling off while conveyed is provided around the conveyance drive member 33 of the substrate-holder conveyance mechanism 3.

The guide member 38 is formed as a single rail. As illustrated in FIG. 3, the guide member 38 is provided in parallel with the conveyance drive member 33 and extends from the substrate-holder introduction portion 30A above the first drive wheel 31 to the substrate-holder ejection portion 30C below the first drive wheel 31 through the turning conveyance portion 30B.

The guide member 38 is not present in a region on a side of the first drive wheel 31a closer to a substrate carry-in and carry-out mechanism 6, which will be described later.

First and second film formation regions 4 and 5 are provided in the vacuum chamber 2.

According to this embodiment, the first and second film formation regions 4 and 5 are located on opposite sides of the substrate-holder conveyance mechanism 3. The first film formation region 4 is located in the upper portion of the vacuum chamber 2 and includes a first sputtering source 4T. The second film formation region 5 is located in a lower portion of the vacuum chamber 2 and includes a second sputtering source 5T.

A gas introduction mechanism (not illustrated) for introducing a predetermined sputtering gas is provided in each of the first and second film formation regions 4 and 5.

The forward path-side conveyance portion 33a of the conveyance drive member 33 is configured to pass straight through the first film formation region 4. The return path-side conveyance portion 33c is configured to pass straight through the second film formation region 5.

The substrate holders 11 are conveyed such that a planar film-formation surface of the film-formation target substrate 50 held by each substrate holder 11 remains horizontal when each substrate holder 11 passes through the forward path-side conveyance portion 33a and the return path-side conveyance portion 33c of the conveyance drive member 33 having the conveyance path.

The substrate carry-in and carry-out mechanism 6 is provided at a position near the substrate-holder conveyance mechanism 3 in the vacuum chamber 2 (such as, a position adjacent to the first drive wheel 31) for passing the substrate holders 11 to the substrate-holder conveyance mechanism 3 and receiving the substrate holders 11 from the substrate-holder conveyance mechanism 3.

The substrate carry-in and carry-out mechanism 6 of this embodiment has a supporter 62 disposed at a top (upper) end of a drive rod 61 configured to be driven in, for example, the up-and-down directions vertically by an ascending and descending mechanism 60.

In this embodiment, a conveyance robot 64 is provided on the supporter 62 of the substrate carry-in and carry-out mechanism 6. The substrate holders 11 are supported on the conveyance robot 64 and moved in the up-and-down directions vertically. The conveyance robot 64 passes the substrate holders 11 to the substrate-holder conveyance mechanism 3 and receives the substrate holders 11 from the substrate-holder conveyance mechanism 3.

In this embodiment, as will be described later, the substrate holders 11 are passed from the substrate carry-in and carry-out mechanism 6 to the substrate-holder introduction portion 30A of the forward path-side conveyance portion 33a of the substrate-holder conveyance mechanism 3 (the position where this operation is to be performed will hereinafter be referred to as "substrate-holder passing position"). Also, the substrate holders 11 are removed from the substrate-holder ejection portion 30C of the return path-side conveyance portion 33c of the substrate-holder conveyance mechanism 3 (the position where this operation is to be performed will hereinafter be referred to as "substrate-holder removal position").

At, for example, the top of the vacuum chamber 2, there is provided a substrate carry-in and carry-out chamber 2A from which film-formation target substrates 50 are carried into the vacuum chamber 2 and into which the substrates 50 are carried out of the vacuum chamber 2.

The substrate carry-in and carry-out chamber 2A is located, for example, at a position above the supporter 62 of the substrate carry-in and carry-out mechanism 6 with a communication channel 2B therebetween. An openable and closable lid 2a is provided at, for example, the top of the substrate carry-in and carry-out chamber 2A.

As will be described later, the film-formation target substrates 50, having been carried into the substrate carry-in and carry-out chamber 2A, are passed to and held by the substrate holders 11 on the conveyance robot 64 of the supporter 62 of the substrate carry-in and carry-out mechanism 6. On the other hand, the substrates 50 after film formation are carried out into, for example, the atmosphere outside the vacuum chamber 2 from the substrate holders 11 on the conveyance robot 64 of the supporter 62 of the substrate carry-in and carry-out mechanism 6.

In this embodiment, at an outer edge portion of the top of the supporter 62 of the substrate carry-in and carry-out mechanism 6, there is provided a seal member 63 (such as, an O-ring) that serves to separate the atmosphere inside the vacuum chamber 2 from that inside the substrate carry-in and carry-out chamber 2A when the film-formation target substrates 50 are carried in and out.

In this configuration, the supporter 62 of the substrate carry-in and carry-out mechanism 6 is caused to ascend toward the substrate carry-in and carry-out chamber 2A, and the seal member 63 on the supporter 62 is brought into tight contact with the inner wall of the vacuum chamber 2 to block the communication channel 2B, whereby the atmosphere inside the substrate carry-in and carry-out chamber 2A is separated from the atmosphere inside the vacuum chamber 2.

At a location near the first film formation region 4, a pair of heating and cooling mechanisms 7a and 7b having heating and cooling features are provided for heating and cooling the film-formation target substrates 50 held by the substrate holders 11.

In this embodiment, the heating and cooling mechanisms 7a and 7b are arranged above and below the conveyance path, respectively, in an area between the first drive wheel 31 and the first film formation region 4, so that the substrate 50 on which film formation is to be performed in the first film formation region 4 can be heated or cooled at both of opposite surfaces thereof (i.e., the surface to be subjected to film formation) and the opposite, non-film formation surface.

As illustrated in FIG. 2, the substrate-holder conveyance mechanism 3 of this embodiment includes a frame structure 8 including: a flat plate-shaped base frame 25 provided in parallel with a horizontal plane; and a pair of flat plate-shaped side frames 26 provided on the base frame 25, extending in the vertical direction and arranged in parallel with each other with a predetermined spacing therebetween. Various members to be described later are assembled with the frame structure 8 in such a manner as to be, for example, symmetrical with respect to the conveyance direction, thereby constituting the substrate-holder conveyance mechanism 3 as an integrated unit.

The substrate-holder conveyance mechanism 3 can be removably installed within the vacuum chamber 2 via an installation portion 17 provided in the frame structure body 8.

In the substrate-holder conveyance mechanism 3, the foregoing first and second drive wheels 31 and 32 are provided on both of to the paired side frames 26.

The first drive wheels 31 have a drive shaft 31a configured to rotate about a rotation axis extending in a direction orthogonal to the conveyance direction, and the first drive wheels 31 are configured to rotate about the drive shaft 31a.

On the other hand, the second drive wheels 32 have their respective drive shafts 35 configured to be driven to rotate about an identical rotation axis orthogonal to the conveyance direction. Each drive shaft 35 is coupled with a corresponding one of the second drive wheels 32 via a coupling member 34 (see FIG. 2 and FIGS. 5(a) and 5(b)).

The conveyance drive member 33 is placed over the first and second drive wheels 31 and 32 provided on each of the paired side frames 26. The conveyance path for conveying the substrate holders 11 is thereby formed.

The substrate-holder conveyance mechanism 3 of this embodiment is thus configured such that the forward path-side conveyance portion (first conveyance portion) 33a on the upper side of the conveyance drive member 33 and the return path-side conveyance portion (second conveyance portion) 33c on the lower side of the conveyance drive member 33 are opposed to each other and coincide with each other in the vertical direction (see FIGS. 1 and 2).

As illustrated in FIG. 3, a plurality of hold drive portions 36 are provided at predetermined intervals on each of the paired conveyance drive members 33.

The hold drive portions 36 serve to hold, convey, and drive the substrate holders 11 and are attached to the conveyance drive members 33 in such a manner as to protrude outwardly from the conveyance drive members 33. At the distal end of each hold drive portion 36, there is a holding recess portion 37 formed to face toward, for example, the downstream side in the conveyance direction and to have a, for example, J-hook shape (such a shape that the height of the protrusion is lower on the downstream side in the conveyance direction than on the upstream side in the conveyance direction).

As illustrated in FIG. 2, at positions inside the pair of conveyance drive members 33, a pair of substrate-holder support mechanisms 18 for supporting the substrate holders 11 being conveyed are provided between the first and second drive wheels 31 and 32.

The substrate-holder support mechanisms 18 are each formed of rotatable members (such as, a plurality of rollers), and are respectively disposed near the conveyance drive members 33.

In this embodiment, as illustrated in FIGS. 2 and 3, a forward path-side substrate-holder support mechanism 18a is provided near the forward path-side conveyance portion 33a of the conveyance drive member 33, and a return path-side substrate-holder support mechanism 18b is provided near the return path-side conveyance portion 33c of the conveyance drive member 33. They are arranged to support both edge portions of the lower surfaces of the substrate holders 11 being conveyed.

The forward path-side substrate-holder support mechanism 18a is provided to extend linearly with one end portion as the starting end portion located in the substrate-holder introduction portion 30A and the other end portion as the terminal end portion located nearest the turning conveyance portion 30B, while the first film formation region 4 (see FIG. 1) is interposed between the starting end portion and the terminal end portion.

The return path-side substrate-holder support mechanism 18b is provided to extend linearly, with one end portion as the starting end portion located at the position of the turning conveyance portion 30B on the side of the second drive wheel 32 and the other end portion as the terminal end portion located at the position of the substrate-holder ejection portion 30C, while the second film formation region 5 (see FIG. 1) interposed between the starting end portion and the terminal end portion.

The substrate holder 11 used in this embodiment is for performing film formation on both surfaces of the film-formation target substrate 50, and includes a tray-shaped portion with an opening penetrating therethrough.

As illustrated in FIGS. 4(a), 4(b) and 4(c), the substrate holder 11 includes a main body 11A shaped like, for example, a long frame, and a plurality of holder portions 13 provided in the main body 11A. The holder portions 13 are configured to align a plurality of film-formation target substrates 50 each having, for example, a rectangular shape, in the longitudinal direction of the main body 11A (i.e., in a direction orthogonal to the conveyance direction), and hold the substrates 50.

Each holder portion 13 has an opening 14 of, for example, a rectangular shape, on a side (first side) of the main body 11A that is to be the front side during conveyance. The opening 14 has the same size and shape as those of the film-formation target substrate 50, so that the front surface of each film-formation target substrate 50 is entirely exposed through the opening 14. Each holder portion 13 further has an opening 15 of, for example, a rectangular shape, on the other side (second side) of the main body 11A that is to be the back side during conveyance. The opening 15 communicates with the opening 14 and is smaller than the film-formation target substrate 50 in size.

Each holder portion 13 further has a shield portion 16 located in the middle of the main body 11A in its thickness direction. The shield portion 16 includes a rectangular frame-shaped recess in which the film-formation target substrate 50 is placeable.

The bottom of the recess is formed to be planar and parallel to, for example, the front side and back side of the main body 11A. Each shield portion 16 is thus configured so that the film-formation target substrate 50 is placed thereon and held in a horizontal position for the film formation process.

With the substrate holder 11 of this embodiment having such a configuration, when performing film formation on both surfaces of a plurality of film-formation target substrates 50 held by a plurality of holder portions 13, the front surface (first surface) of each substrate 50 is entirely exposed, while the edge portion of the back surface (second surface) of the substrate 50 is covered by a thick portion of the shield portion 16 of the main body 11A. As a result, sputtering particles, which travel from the second sputtering source 5T, are prevented from being deposited on the edge portion.

In the substrate holder 11, support shafts 12 are provided at opposite ends of the main body 11A in the longitudinal direction thereof in a location closer to one end of the main body 11A in the width direction thereof (that is, in the conveyance direction).

The support shafts 12 are formed to have a cross section circular about a rotation axis extending in the longitudinal direction of the main body 11A, and have their respective proximal end portions 12a tapered toward opposite directions, each into a truncated cone shape, and their respective distal end portions 12b cylindrical in shape and smaller in diameter than the proximal end portions 12a.

The dimensions of each portion are determined so that the distal end portion 12b of each support shaft 12 fits into the holding recess portion 37 of the hold drive portion 36 of the conveyance drive member 33 and is held thereby so as to be rotatable about the support shaft 12.

By virtue of such a configuration, when the distal end portion 12b of each support shaft 12 of the substrate holder 11 fits into and is held by the holding recess portion 37 of the hold drive portion 36 of the conveyance drive member 33 for conveyance, positioning of the substrate holder 11 in the direction in which the support shafts 12 extend is effected by abutment between the holding recess portion 37 of the hold drive portion 36 and the aforementioned tapering support shaft 12.

In this embodiment, the dimensions of each member are determined so that a small gap is formed between the guide member 38 and the distal end portion 12b of each support shaft 12 of the substrate holder 11 when the distal end portion 12b of the support shaft 12 of the substrate holder 11 fits into and is supported by the holding recess portion 37 of the hold drive portion 36 of the conveyance drive member 33.

By virtue of such a configuration, when the distal end portion 12b of each support shaft 12 of the substrate holder 11 fits into and is supported by the holding recess portion 37 of the hold drive portion 36 of the conveyance drive member 33 for conveyance, abutment between the guide member 38 and the distal end portion 12b of the support shaft 12 of the substrate holder 11 prevents the substrate holder 11 from falling off from the conveyance path.

The turning conveyance portion 30B of the substrate-holder conveyance mechanism 3 of this embodiment is configured as described below.

First, as illustrated in FIG. 3 and FIGS. 5(a) and 5(b), an attitude control mechanism 20 is provided in the substrate-holder conveyance mechanism 3 at a position adjacent to the second drive wheel 32 on a side thereof closer to the first drive wheel 31. The attitude control mechanism 20 is configured to support the substrate holders 11 and control the attitude thereof when conveying the substrates 50 in such a manner as to make a turn.

The attitude control mechanism 20 has a drive shaft 21 extending in a direction orthogonal to the conveyance direction. The drive shaft 21 penetrate through the pair of side frames 26 and is rotatably supported.

A pair of support arms 22 are attached to the drive shaft 21 with a spacing between the paired support arms 22, the spacing being smaller than that between the paired substrate-holder support mechanisms 18 (see FIG. 5(a)).

The support arms 22 are each formed of a straight rod-like member, and support rollers 23 are respectively provided at opposite ends of each support arm 22.

The drive shaft 21 of the support arms 22 is coupled with the drive shafts 35 of the second drive wheel 32 via, for example, a belt-like power transmission member 24. This enables the second drive wheel 32 and the support arms 22 to be synchronously rotated in the same direction in a predetermined relationship, as will be described later.

Now, the operation of the film formation apparatus 1 of this embodiment and a film formation method using this film formation apparatus 1 will be described with reference to FIGS. 6 to 16. By way of example, a case of forming a transparent conductive oxide layer of a heterojunction solar battery will be described herein.

For ease of understanding, the following description will be made with reference to a single substrate holder 11 and a single film-formation target substrate 50 held by the substrate holder 11 for undergoing the film formation process.

Also, assume that the substrate holder 11 is introduced into the substrate-holder introduction portion 30A such that the side thereof having the support shafts 12 faces forward (see FIG. 9(a)).

Figure 6:
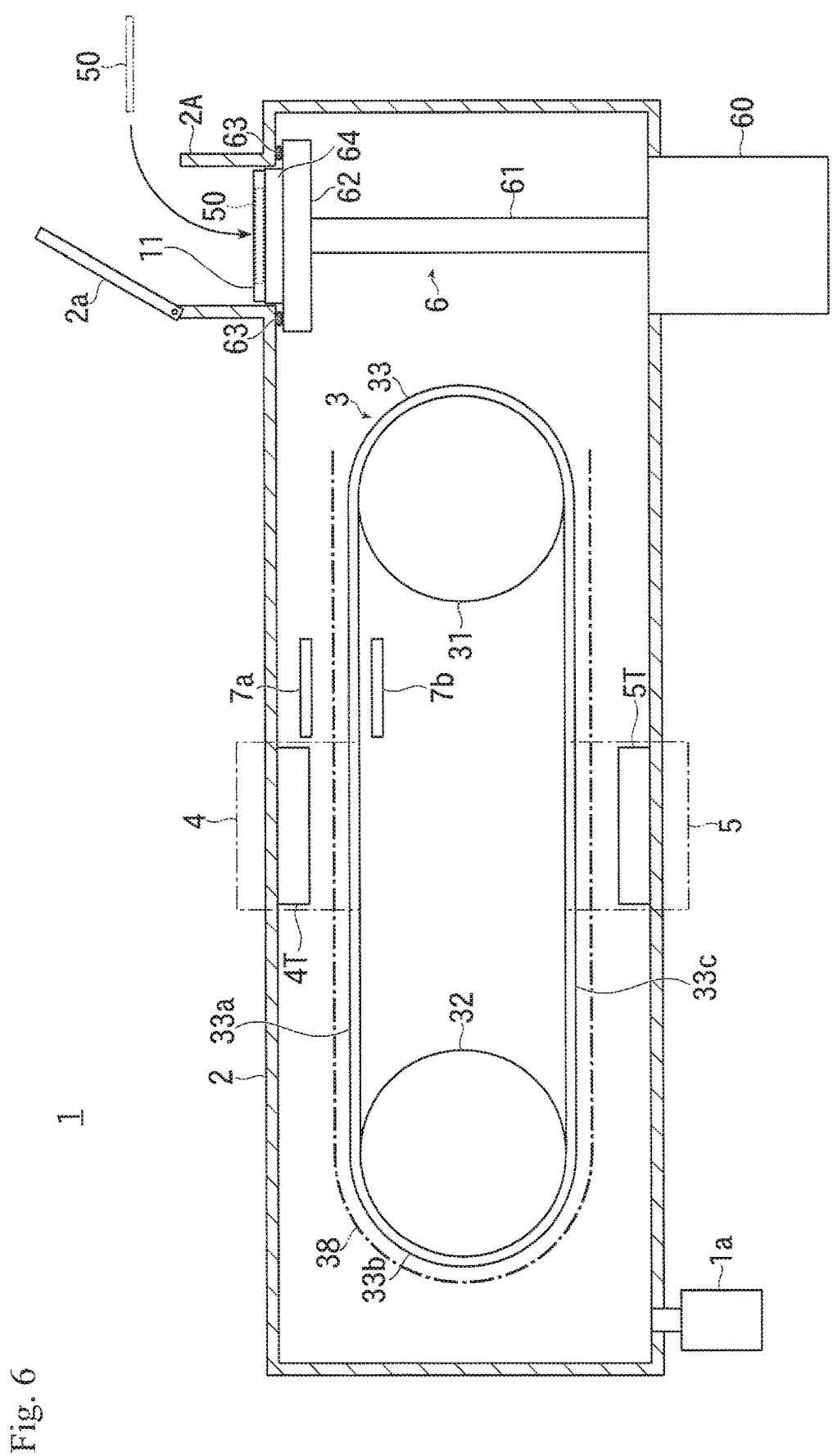
FIG. 6 is an explanatory diagram illustrating an operation of the film formation apparatus and a film formation method of this embodiment (part 1).

In this embodiment, as illustrated in FIG. 6, the lid 2a of the substrate carry-in and carry-out chamber 2A is opened with the atmosphere inside the substrate carry-in and carry-out chamber 2A separated from the atmosphere inside the vacuum chamber 2 by bringing the seal member 63 on the supporter 62 of the substrate carry-in and carry-out mechanism 6 into tight contact with the inner wall of the vacuum chamber 2. Then, the film-formation target substrate 50 is mounted onto and held by the substrate holder 11 on the conveyance robot 64 of the supporter 62 of the substrate carry-in and carry-out mechanism 6, using a conveyance robot that is not illustrated.

Here, the film-formation target substrate 50 is one such as illustrated in FIG. 16(a), an i-type amorphous silicon layer 52 and a p-type amorphous silicon layer 53 are stacked in this order on a first surface (the upper surface in the figure) of an n-type crystalline silicon substrate 51, and an i-type amorphous silicon layer 56 and an n-type amorphous silicon layer 57 are stacked in this order on a second surface (the lower surface in the figure) of the n-type crystalline silicon substrate 51.

Figure 7:
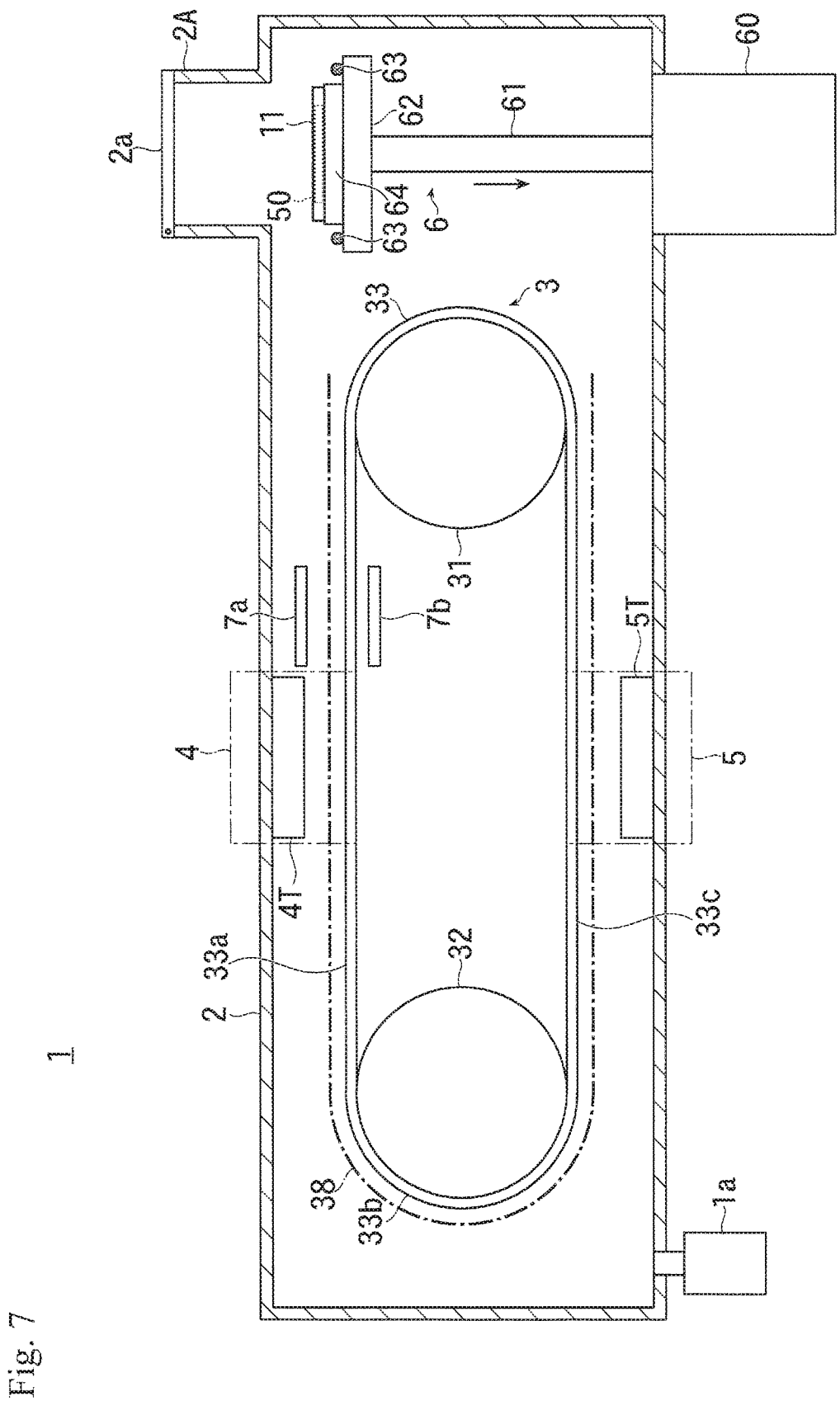
FIG. 7 is an explanatory diagram illustrating the operation of the film formation apparatus and the film formation method (part 2).

Then, as illustrated in FIG. 7, the lid 2a of the substrate carry-in and carry-out chamber 2A is closed, and thereafter the supporter 62 of the substrate carry-in and carry-out mechanism 6 is caused to descend to the substrate-holder passing position to bring the substrate holder 11 to the same level as that of the forward path-side conveyance portion 33a of the conveyance drive member 33.

Figure 8:
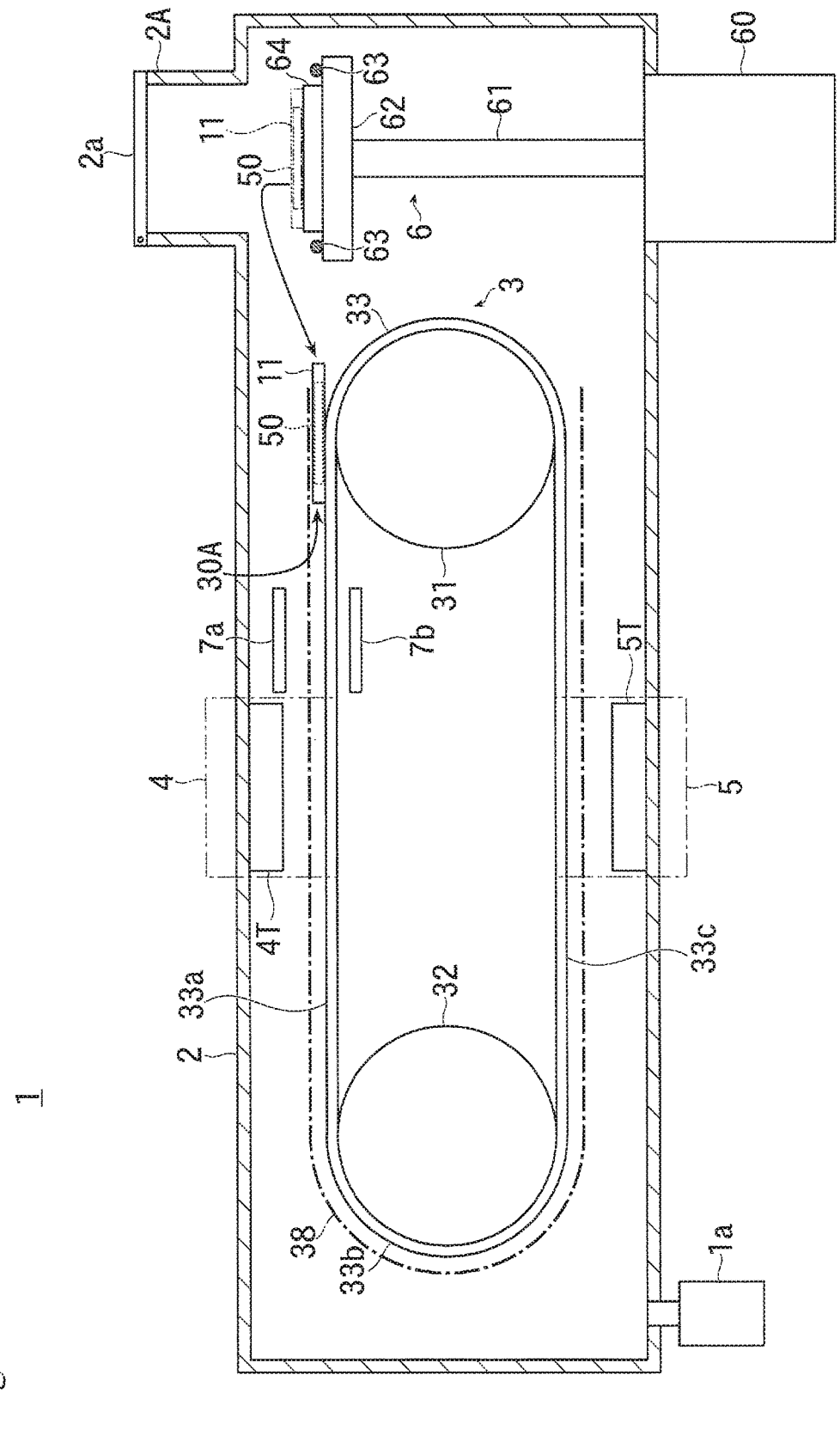
FIG. 8 is an explanatory diagram illustrating the operation of the film formation apparatus and the film formation method (part 3).

Then, as illustrated in FIG. 8, the substrate holder 11 is set into the substrate-holder introduction portion 30A of the substrate-holder conveyance mechanism 3 by the conveyance robot 64 provided on the supporter 62 of the substrate carry-in and carry-out mechanism 6.

In this manner, as illustrated in FIG. 9(a), the lower surface 11b of the substrate holder 11 is supported by the forward path-side substrate-holder support mechanism 18a.

Next, the first and second drive wheels 31 and 32 of the substrate-holder conveyance mechanism 3 are operated to move the forward path-side conveyance portion 33a of the conveyance drive member 33 from the first drive wheel 31 toward the second drive wheel 32, and also move the return path-side conveyance portion 33c of the conveyance drive member 33 from the second drive wheel 32 toward the first drive wheel 31.

As a result, as illustrated in FIG. 9(b), the holding recess portions 37 of the hold drive portions 36 located on the conveyance drive member 33 receive the pair of support shafts 12 of the substrate holder 11 to allow the support shafts 12 to be held by the hold drive portions 36, so that the substrate holder 11 is conveyed on the forward path-side conveyance portion 33a of the conveyance drive member 33 toward the turning conveyance portion 30B near the second drive wheel 32.

Then, the substrate holder 11 and the film-formation target substrate 50 are heated by the heating and cooling mechanisms 7a and 7b, illustrated in FIG. 8, and thereafter, while they pass through the first film formation region 4, film formation is performed by sputtering, using the first sputtering source 4T located above the substrate holder 11, onto the front surface (i.e., the first surface) of the film-formation target substrate 50 held by the substrate holder 11 (see FIG. 1).

Specifically, a first transparent conductive oxide layer 54 is formed (see FIG. 16(b)) by sputtering onto the surface of the p-type amorphous silicon layer 53 of the film-formation target substrate 50, as illustrated in FIG. 16(a).

As described above, in this embodiment, the front surface (first surface) of the film-formation target substrate 50 held by the substrate holder 11 is entirely exposed. Accordingly, as illustrated in FIG. 16(b), sputtering particles traveling from the first sputtering source 4T form the first transparent conductive oxide layer 54 over the entire surface of the p-type amorphous silicon layer 53 of the film-formation target substrate 50.

FIGS. 10(a), 10(b) and 10(c) are explanatory diagrams illustrating the operation of the turning conveyance portion of the substrate-holder conveyance mechanism of this embodiment.

In this embodiment, as described above, the substrate holder 11 is conveyed toward the turning conveyance portion 30B with the support shafts 12 of the substrate holder 11 held by the hold drive portions 36 of the conveyance drive member 33 and with the lower surface 11b of the substrate holder 11 supported by the forward path-side substrate-holder support mechanism 18 (see FIGS. 9(a) and 9(b)).

The dimensions of the substrate holder 11, the position where the support shafts 12 are situated, and the dimensions of the forward path-side substrate-holder support mechanism 18a are set so that when the support shafts 12 of the substrate holder 11 reach the top of the second drive wheel 32 in the turning conveyance portion 30B, the rear end portion of the substrate holder 11 is detached from the terminal end portion 18c of the forward path-side substrate-holder support mechanism 18a, as illustrated in FIG. 10(a).

As described above, the substrate holder 11 is rotatable about the support shaft 12 when the distal end portions 12b of the pair of support shafts 12 are held by the holding recess portions 37 of the hold drive portions 36 of the conveyance drive member 33. This embodiment is thus configured so that, when the substrate holder 11 is detached from the terminal end portion 18c of the forward path-side substrate-holder support mechanism 18a, the support roller 23 provided at one end of each of the paired support arms 22 of the attitude control mechanism 20a supports a part of the lower surface 11b of the substrate holder 11 on its rear-end side relative to the support shafts 12 so as to keep the lower surface 11b horizontal.

As described above, the pair of support arms 22 of the attitude control mechanism 20 are configured to rotate in the same direction as the second drive wheel 32 in synchronization with the second drive wheel 32.

As illustrated in FIG. 10(b), in this embodiment, as the conveyance drive member 33 moves, the hold drive portion 36 moves from the forward path-side conveyance portion 33a via the turning portion 33b to the return path-side conveyance portion 33c.

During this movement, the support shafts 12 of the substrate holder 11 move in an arc along the periphery of the second drive wheel 32 for descending. In this embodiment, the dimensions and rotational angle of the support arm 22 of the attitude control mechanism 20 are set so that during the aforementioned movement, the rear-end side part of the lower surface 11b of the substrate holder 11 is supported by the support roller 23 situated at one end of the support arm 22 of the attitude control mechanism 20 to keep the attitude of the substrate holder 11 substantially horizontal.

The foregoing movement causes the support shafts 12 of the substrate holder 11 supported by the holding recess portions 37 of the hold drive portions 36 to be at a lower position than the holding recess portion 37 of the hold drive portion 36. This causes gravitational action to occur to produce a force acting on the support shafts 12 of the substrate holder 11 in the direction away from the holding recess portions 37 of the hold drive portions 36. However, according to the configuration of this embodiment, when the distal end portion 12b of each support shaft 12 of the substrate holder 11 fits into and is held by the holding recess portion 37 of the hold drive portion 36 of the conveyance drive member 33, a small gap is formed between the distal end portion 12b of the support shaft 12 of the substrate holder 11 and the guide member 38. As a result, the distal end portion 12b of each support shaft 12 of the substrate holder 11 comes into contact with and is supported by the inner portion of the guide member 38 with a small gap between the distal end portion 12b and the holding recess portion 37 of the hold drive portion 36.

Consequently, in this embodiment, the substrate holder 11 does not fall off from the hold drive portion 36 of the conveyance drive member 33 when passing through the turning conveyance portion 30B.

As illustrated in FIG. 10(c), when the support shafts 12 of the substrate holder 11 reach a position below the second drive wheel 32 in the turning conveyance portion 30B, the end of the substrate holder 11 opposite from the side where the support shafts 12 are provided becomes the forward end in the conveyance direction. In this embodiment, the dimensions and rotational angle of the support arm 22 of the attitude control mechanism 20 are set so that at this stage, the forward-end-side portion of the lower surface 11b of the substrate holder 11 is smoothly supported by the return path-side substrate-holder support mechanism 18b and that the support roller 23 of the support arm 22 is separated from the lower surface 11b of the substrate holder 11.

Also, the dimensions and rotational angle of the support arm 22 of the attitude control mechanism 20 are set so that at this stage, the support roller 23a at the other end of the support arm 22 supports the lower surface 11b of the subsequent substrate holder 11.

Figures 11A, 11B:
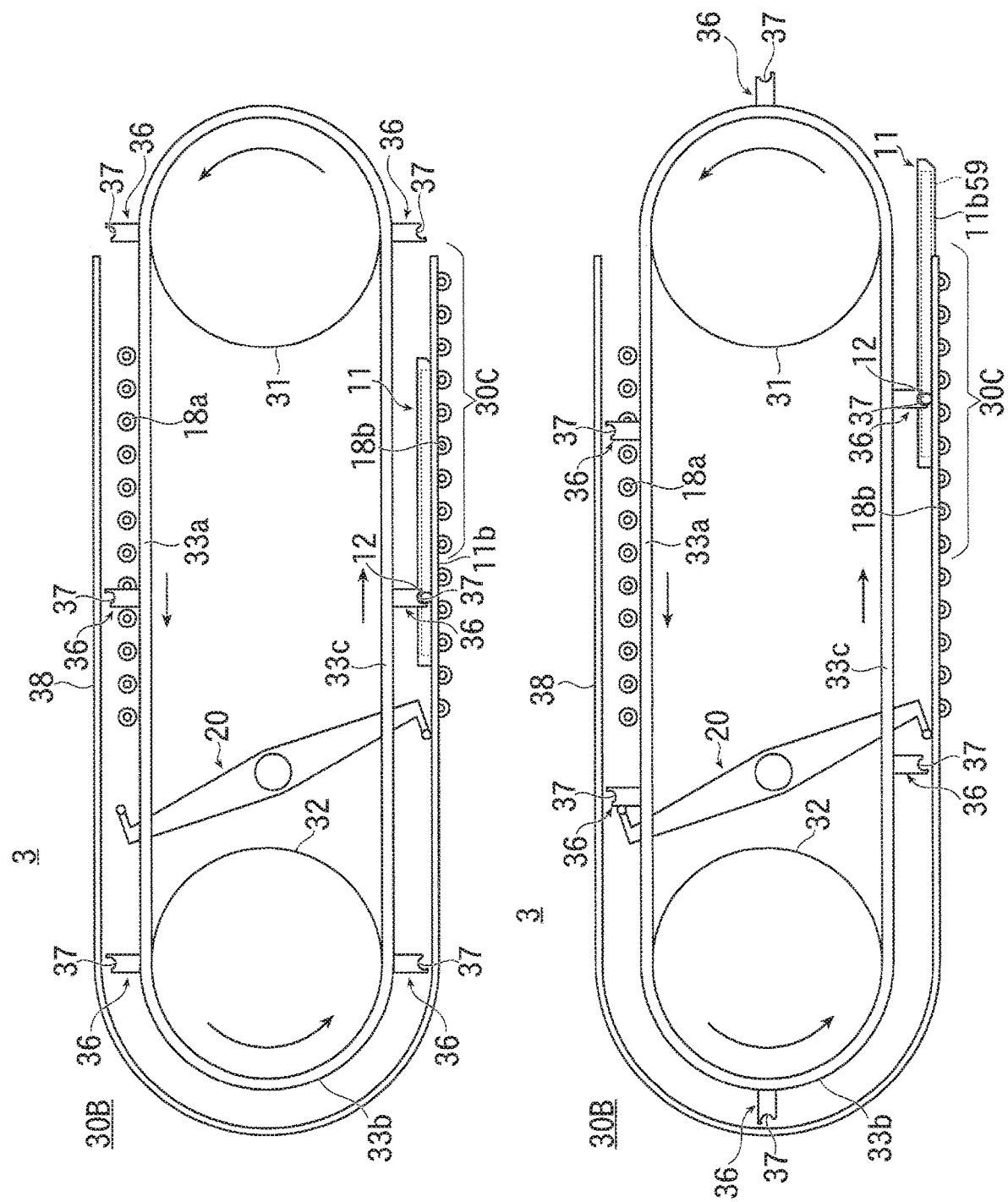
FIGS. 11(a) and 11(b) are explanatory diagrams illustrating the operation of the substrate-holder conveyance mechanism (part 2).
Figure 12:
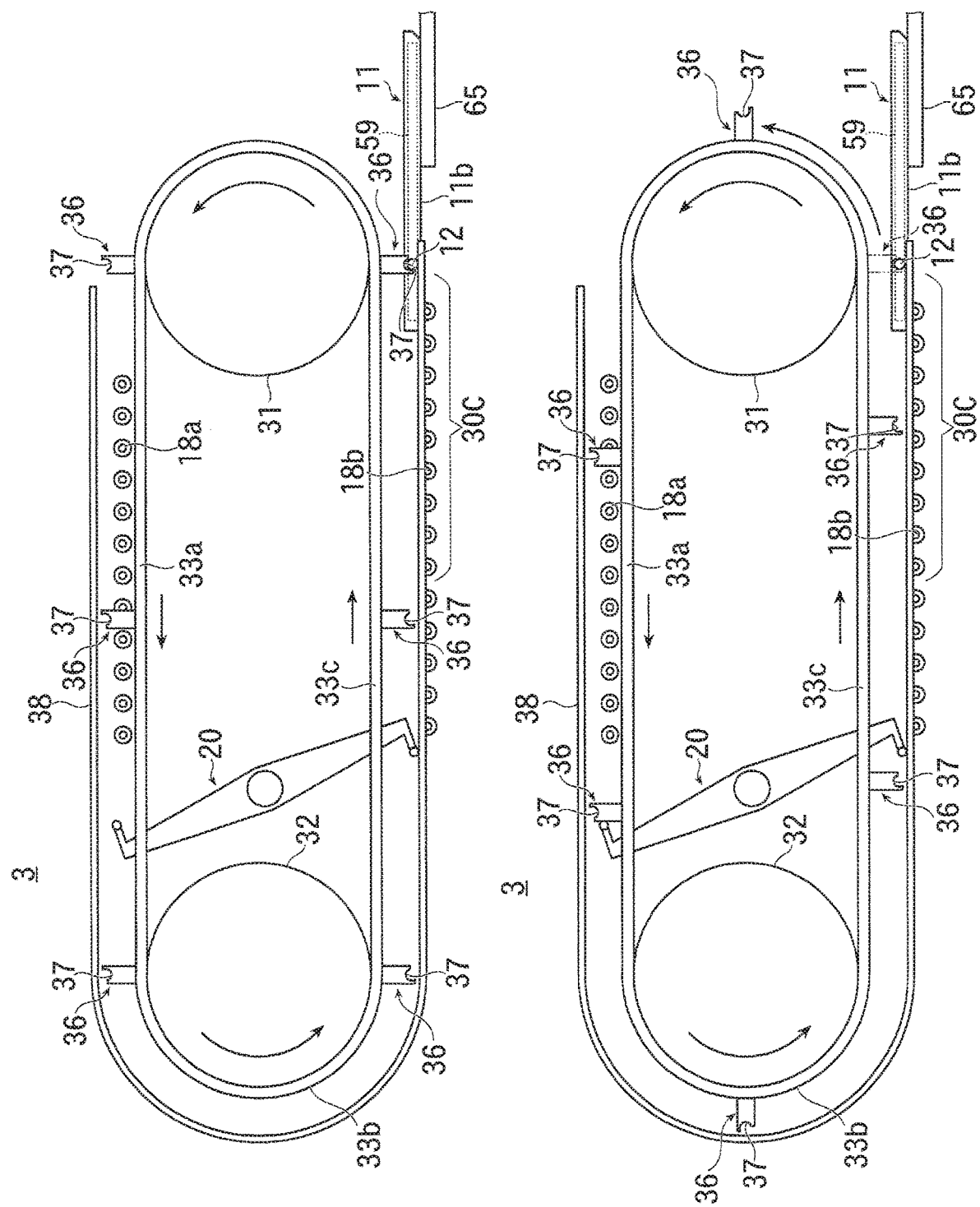
FIGS. 12(a) and 12(b) are explanatory diagrams illustrating the operation of the substrate-holder conveyance mechanism (part 3).

Subsequently, by continuing the operation of the first and second drive wheels 31 and 32 of the substrate-holder conveyance mechanism 3, as illustrated in FIGS. 11(a) and 11(b), the substrate holder 11 supported by the return path-side substrate-holder support mechanism 18b is moved by the operation of the hold drive portion 36 of the return path-side conveyance portion 33c of the conveyance drive member 33 from the turning conveyance portion 30B to the substrate-holder ejection portion 30C.

During this operation, when the film-formation target substrate 50 held by the substrate holder 11 passes through the second film formation region 5 (see FIG. 1), film formation process is performed by sputtering onto the film-formation target substrate 50 using the second sputtering source 5T located below the substrate holder 11.

Film formation at this time is performed onto the back surface (i.e., the second surface opposite to the first surface) of the film-formation target substrate 50 because, as described previously, the substrate-holder conveyance mechanism 3 of this embodiment does not change the up/down orientation of the substrate holder 11 while it is conveyed through the turning conveyance portion 30B.

Specifically, a transparent conductive oxide layer 58 is formed by sputtering, as described below, on the surface of the n-type amorphous silicon layer 57 of the film-formation target substrate 50 illustrated in FIG. 16(b).

In this embodiment, as discussed previously, the edge portion of the back surface (second surface) of the film-formation target substrate 50 held by the substrate holder 11 is covered with the foregoing shield portion 16. As a result, as illustrated in FIG. 16(c), the transparent conductive oxide layer 58 is formed only in the region other than the edge portion of the surface of the n-type amorphous silicon layer 57 serving as an underlayer. In this manner, a substrate 59 after film formation is obtained as intended.

Subsequently, the substrate holder 11 reaches the substrate-holder ejection portion 30C and thereafter reaches the terminal end portion of the guide member 38 of the substrate-holder ejection portion 30C. At this point, as illustrated in FIG. 12(a), a portion of the substrate holder 11 on the downstream (forward) side in the conveyance direction protrudes from the terminal end portions of the return path-side substrate-holder support mechanism 18b and the guide member 38. When in this state, the supporter 62 of the substrate carry-in and carry-out mechanism 6 is set to the substrate-holder removal position (see FIG. 13), and the lower surface 11b of the substrate holder 11 is supported by a mounting portion 65 constituting the conveyance robot 64 of the substrate carry-in and carry-out mechanism 6.

By further continuing the operation of the conveyance drive member 33, the hold drive portions 36 moving together with the conveyance drive member 33 at the periphery of the first drive wheel 31 separate from the support shafts 12 of the substrate holder 11 and move upward in an arc along with the conveyance drive member 33. Consequently, as illustrated in FIG. 12(b), the fits between the hold drive portions 36 of the conveyance drive member 33 and the support shafts 12 of the substrate holder 11 are released to cause the substrate holder 11 to stop at the position.

Figure 13:
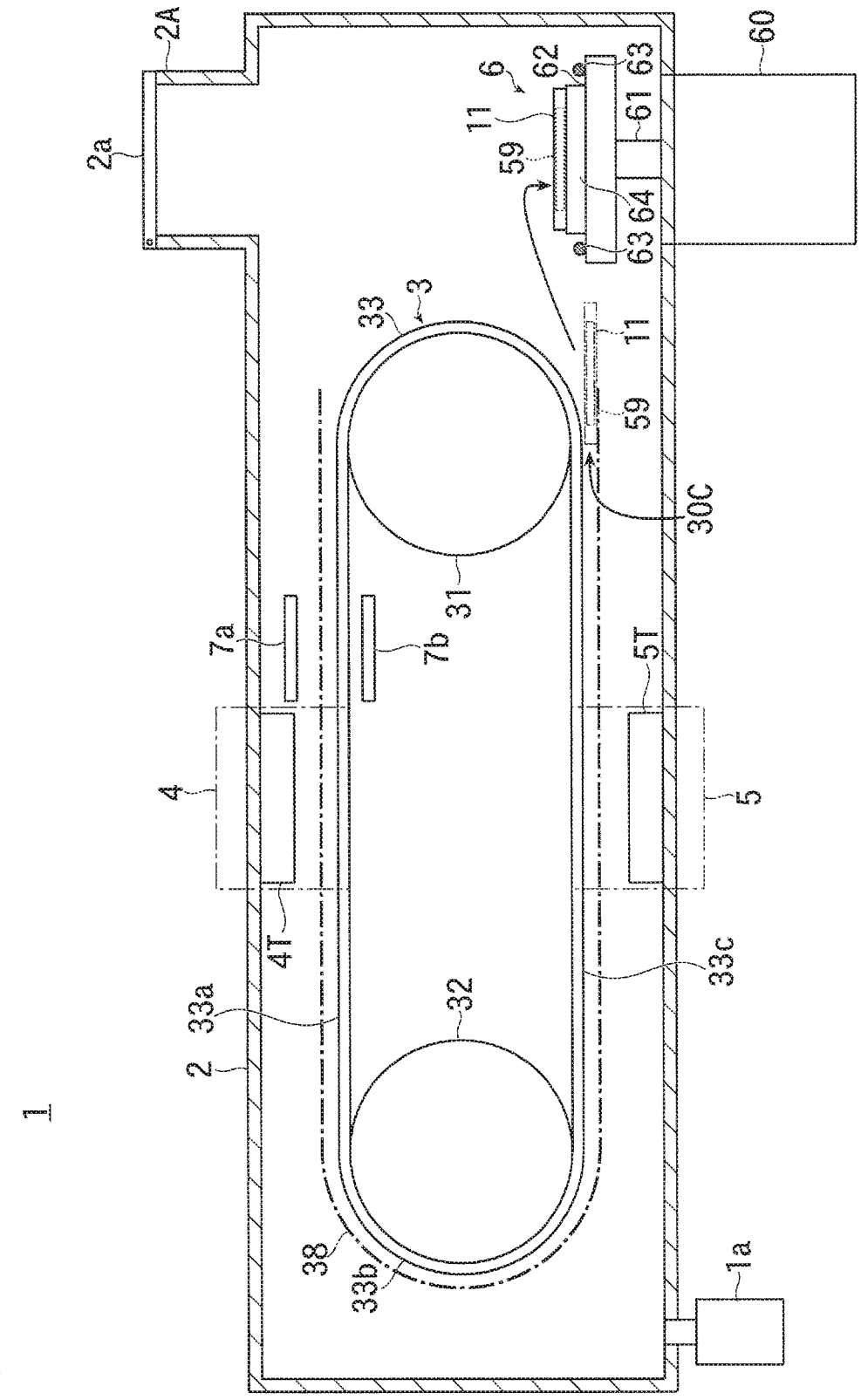
FIG. 13 is an explanatory diagram illustrating the operation of the film formation apparatus (part 4).

Then, as illustrated in FIG. 13, using the conveyance robot 64, the substrate holder 11 is taken out of the substrate-holder ejection portion 30C, moved toward the substrate carry-in and carry-out mechanism 6, and placed together with the conveyance robot 64 on the supporter 62.

Figure 14:
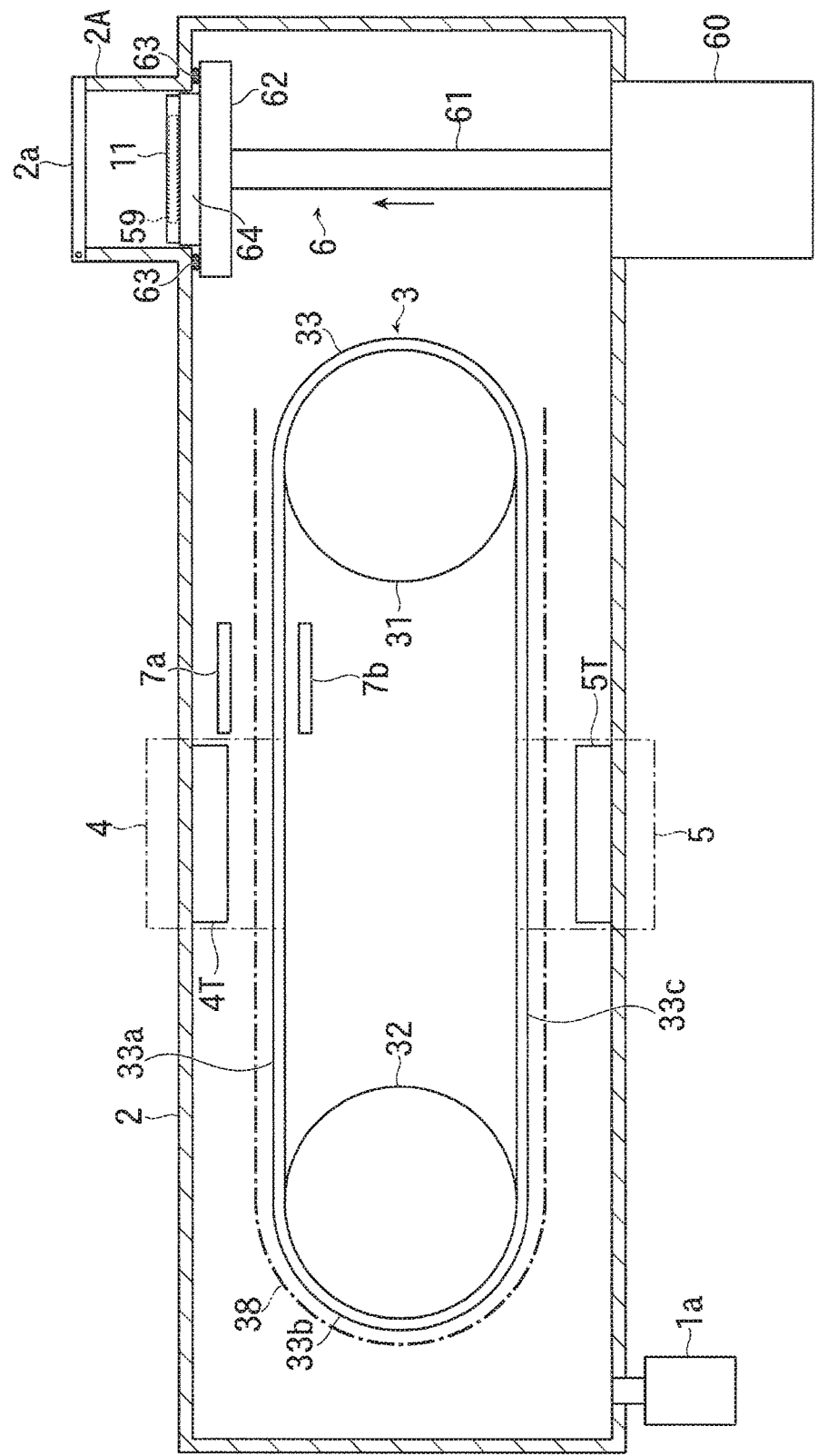
FIG. 14 is an explanatory diagram illustrating the operation of the film formation apparatus (part 5).

Subsequently, as illustrated in FIG. 14, the supporter 62 of the substrate carry-in and carry-out mechanism 6 is caused to ascend, and the seal member 63 on the supporter 62 is brought into tight contact with the inner wall of the vacuum chamber 2 to isolate the atmosphere inside the substrate carry-in and carry-out chamber 2A from the atmosphere inside the vacuum chamber 2.

Figure 15:
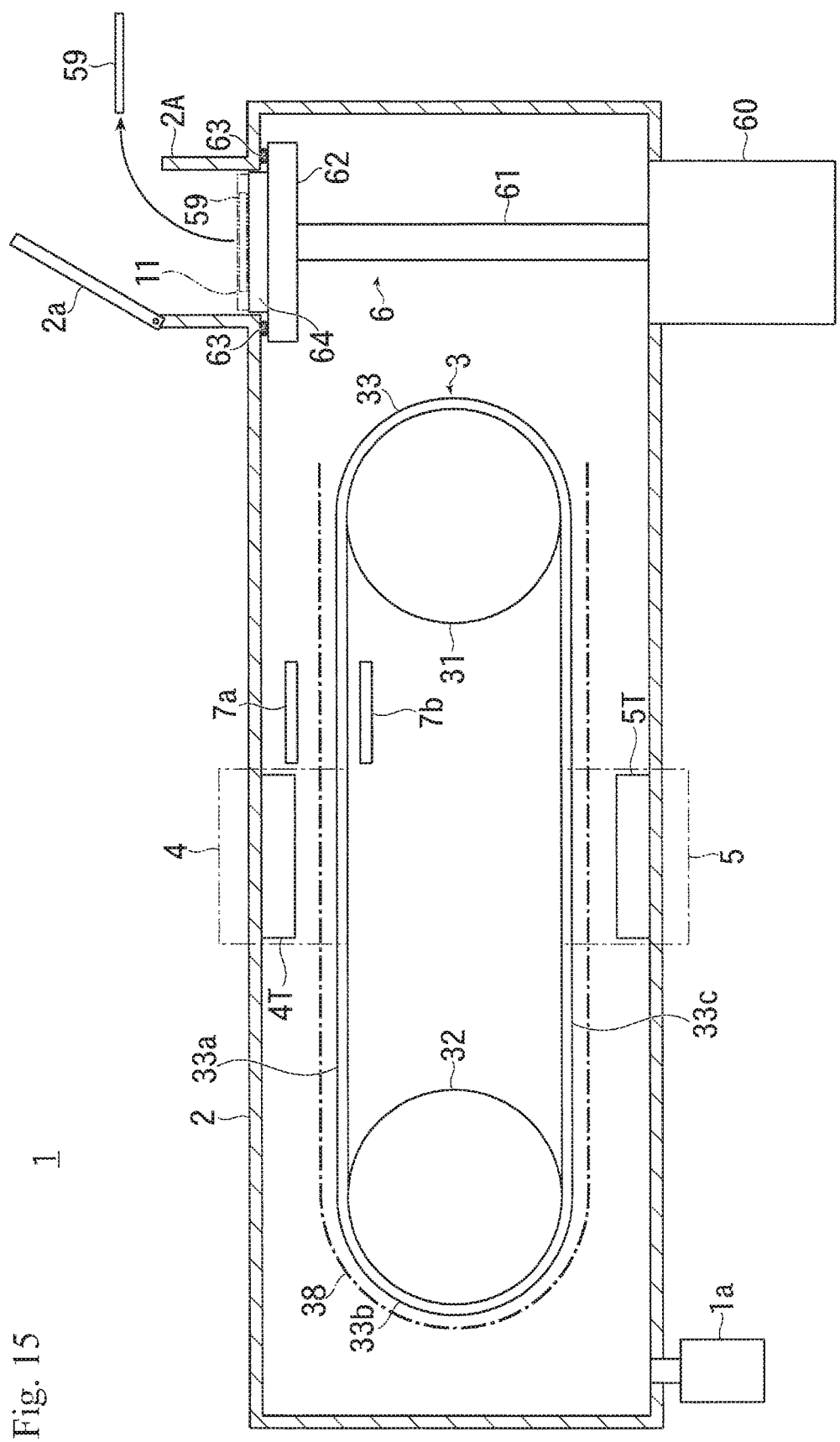
FIG. 15 is an explanatory diagram illustrating the operation of the film formation apparatus (part 6).
Figure 16:
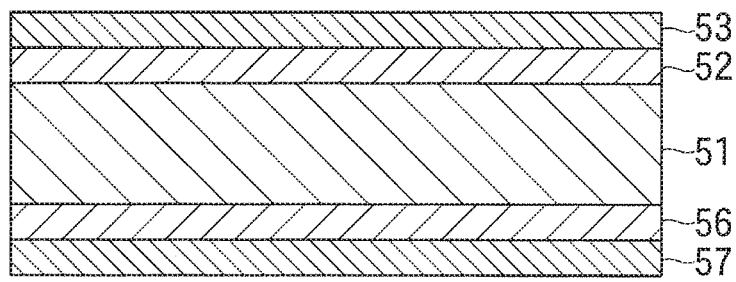
FIGS. 16(a), 16(b) and 16(c) are cross-sectional process diagrams illustrating a method of forming a transparent conductive oxide layer according to this embodiment.
Figure 16:
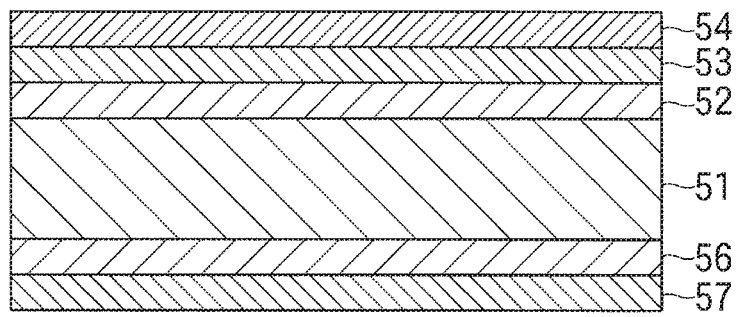
Figure 16:
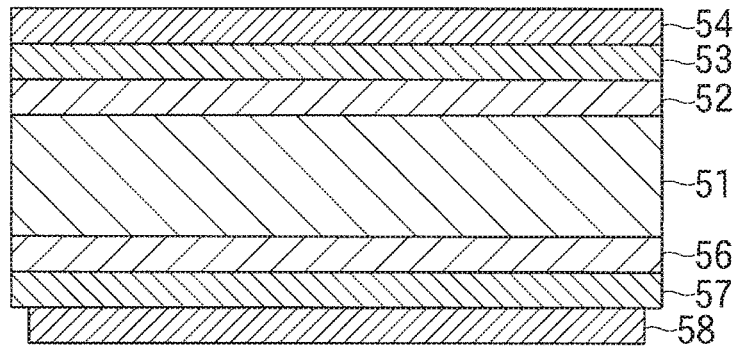

Then, as illustrated in FIG. 15, the lid 2a of the substrate carry-in and carry-out chamber 2A is opened, and the substrate 59 after film formation is removed from the substrate holder 11 and exposed to the outside air using a conveyance robot that is not illustrated.

Upon completion of the foregoing, the film formation process of this embodiment ends.

Any suitable known method can be used to form electrode layers on the first and second transparent conductive oxide layers 54 and 58 of the substrate 59 obtained according to this embodiment.

As has been described, in this embodiment, the substrate-holder conveyance mechanism 3 is configured so that: the forward path-side conveyance portion 33a conveys the substrate holder 11 in a predetermined direction along the conveyance path so that the substrate holder 11 passes through the first film formation region 4; film formation is performed by sputtering on the first surface of the film-formation target substrate 50 held by the substrate holder 11; the turning conveyance portion 30B conveys the substrate holder 11 from the forward path-side conveyance portion 33a to the return path-side conveyance portion 33c in such a manner as to make a turn along the conveyance path while maintaining the up/down orientation of the substrate holder 11; the return path-side conveyance portion 33c conveys the substrate holder 11 in a direction opposite to the direction of conveyance by the forward path-side conveyance portion 33a along the conveyance path so that the substrate holder 11 passes through the second film formation region 5; and film formation is performed by sputtering on the second surface of the film-formation target substrate 50 held by the substrate holder 11.

The substrate holder 11 used in this embodiment has the openings 14 and 15 through which the first and second surfaces of the film-formation target substrate 50 are exposed, and includes the shield portion 16 for shielding the edge portion of the film-formation target substrate 50 from the film formation material supplied from the second sputtering source 5T. In this case, when film formation by sputtering is performed on the first surface and the second surface of the film-formation target substrate 50 held by the substrate holder 11 at the forward path-side conveyance portion 33a and the return path-side conveyance portion 33c, respectively, the edge portion of the film-formation target substrate 50 is shielded from the film formation material supplied from the second sputtering source 5T.

This embodiment thus makes it possible that, on the first-surface side of the film-formation target substrate 50, the first transparent conductive oxide layer 54 is formed over the entire surface of the p-type amorphous silicon layer 53, whereas on the second-surface side of the film-formation target substrate 50, the second transparent conductive oxide layer 58 is formed on a region of the surface of the n-type amorphous silicon layer 57 other than the edge portion. This enables preventing, with reliability, a short-circuit between the first transparent conductive oxide layer 54 and the second transparent conductive oxide layer 58, which are respectively formed on opposite sides of the film-formation target substrate 50.

Further, in this embodiment, the conveyance path is formed to have a single annular shape when projected onto a vertical plane. Along the conveyance path, the substrate holder 11 is conveyed from the forward path-side conveyance portion 33a to the return path-side conveyance portion 33c in such a manner as to make a turn, with the up/down orientation of the substrate holder 11 maintained. The substrate holder 1 is passed through the first film formation region 4 and the second film formation region 5 at the forward path-side conveyance portion 33a and the return path-side conveyance portion 33c, respectively, during which time sputtering is performed. Using this compact, passing-type film formation apparatus 1, it is possible to form the first and second transparent conductive oxide layers 54 and 58 on opposite surfaces of the film-formation target substrate 50 without using a mask. This results in reduced cost.

According to this embodiment, it is also possible to maximize the area of, for example, the transparent conductive oxide layer 54 on the sunlight side, without causing a short-circuit between the first and second transparent conductive oxide layers 54 and 58 formed on opposite sides of the film-formation target substrate 50. This enables enhancement of the conversion efficiency of a heterojunction solar battery.

Further, in the configuration of this embodiment, a plurality of substrate holders 11, each configured to align a plurality of film-formation target substrates 50 in the direction orthogonal to the conveyance direction and hold the same, are conveyed along the conveyance path. Accordingly, the length of the substrate holder and an extra space associated therewith can be smaller, compared with the case of employing the conventional technique where a substrate holder configured to align a plurality of substrates in the substrate conveyance direction and hold the same is used and conveyed for film formation. This results in space savings for a film formation apparatus.

Moreover, in this embodiment, since the substrate-holder conveyance mechanism 3 is integrally assembled with the frame structure 8 that is attachable to and detachable from the vacuum chamber 2, the manufacturing process and maintenance can be readily conducted.

The present invention is not limited to the foregoing embodiment, and various modifications may be made thereto.

For example, in the foregoing embodiment, the substrate holder 11 configured to align a plurality of film-formation target substrates 50 in a single row in the longitudinal direction of the long, frame-shaped main body 11A and hold the same has been described as an example. However, the present invention is not limited to this example. For example, the substrate holder 11 can also be configured to align a plurality of film-formation target substrates 50 in a plurality of rows (two or three rows) in the longitudinal direction of the main body 11A and hold the same.

In the foregoing embodiment, a rectangular frame shape is selected as the shape of the shield portion 16 provided in the substrate holder 11. However, the present invention is not limited thereto, and various shapes that can cover the edge portion of the film-formation target substrate are selectable. Further, the shield portion 16 need not necessarily shield the entire edge portion of the film-formation target substrate, and can also be configured to, for example, shield only a part of the edge portion in a region on the film-formation target substrate where a short-circuit is more likely to occur.

In the foregoing embodiment, each holder portion 13 is provided with the opening 14, which has the same size and shape as those of the film-formation target substrate 50, on the side (first side) of the main body 11A that is to be the front side during conveyance, and the opening 15, which communicates with the opening 14 and is smaller than the film-formation target substrate 50 in size, on the other (second) side of the main body 11A that is to be the back side during conveyance. However, the present invention is not limited thereto. As far as the film-formation target substrate 50 can be securely held by the substrate holder, the relative positions of the openings 14 and 15*b* in the vertical direction may be reversed.

Further, in the present invention, as far as the film-formation target substrate can be securely held by and smoothly removed from the substrate holder, the substrate holder may be provided with shield portions for shielding the edge portions of both of the first and second surfaces of the film-formation target substrate from the film formation material from the first and second sputtering sources.

The foregoing embodiment has dealt with the case of forming transparent conductive oxide layers on both surfaces of a film-formation target substrate of for example, a heterojunction solar battery. The present invention is not limited thereto, and is applicable to the case of forming various types of sputtered films on both surfaces of a film-formation target substrate.

It should be noted, however, that the present invention is particularly effective for the case of forming transparent conductive oxide layers on both surfaces of a film-formation target substrate for a heterojunction solar battery.

In the foregoing embodiment, the upper portion of the conveyance drive member 33 constituting the substrate-holder conveyance mechanism 3 serves as the forward path-side conveyance portion 33*a*, i.e., the first conveyance portion, and the lower portion of the conveyance drive member 33 serves as the return path-side conveyance portion 33*c*, i.e., the second conveyance portion. However, the present invention is not limited thereto, and their relative positions in the vertical direction may be reversed.

Further, in the foregoing embodiment, the substrate-holder conveyance mechanism 3 is composed of a pair of sprockets and a chain bridging over the sprockets. However, for example, an annular conveyance and drive mechanism using, for example, a belt or rail may also be employed.

Also, the substrate-holder support mechanism 18 may be formed of a belt or rail, instead of a roller.

The foregoing embodiment has dealt with the case where film formation on the film-formation target substrate 50 is performed once in, for example, each of the first and second film formation regions 4 and 5. However, the present invention is not limited thereto. For example, film formation may be performed multiple times in each of the first and second film formation regions 4 and 5 by allowing the film-formation target substrates 50 to pass through the regions 4 and 5 multiple times.

Figure 17:
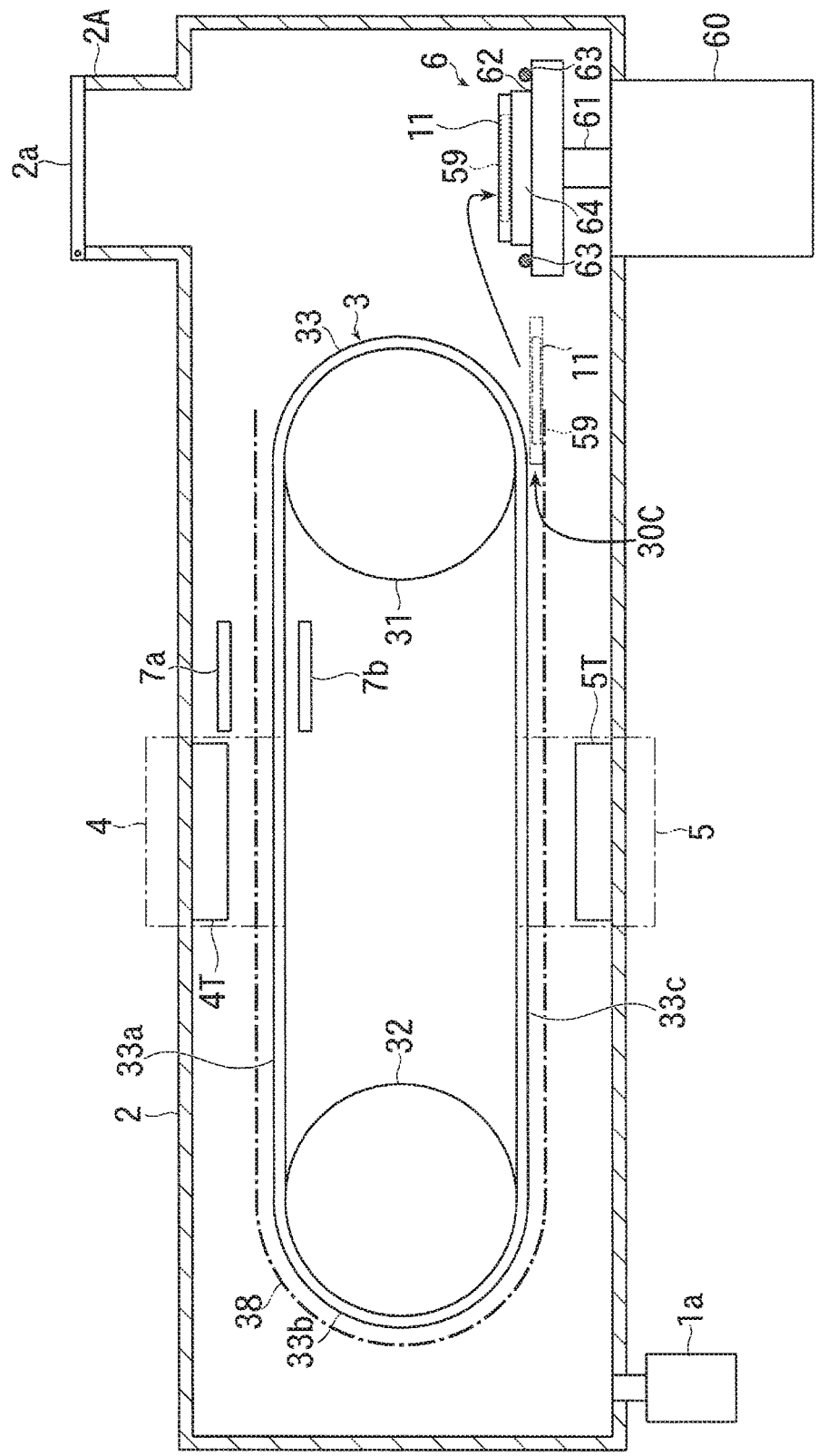
FIG. 17 is an explanatory diagram illustrating an operation for performing film formation on a substrate multiple times (part 1).

In such a case, for example, as illustrated in FIG. 17, the supporter 62 of the substrate carry-in and carry-out mechanism 6 is set at the substrate-holder removal position, and then using the conveyance robot 64, the substrate holder 11 holding the substrate 59 after the first film formation is taken out of the substrate-holder ejection portion 30C, moved toward the substrate carry-in and carry-out mechanism 6, and placed together with the conveyance robot 64 on the supporter 62.

Figure 18:
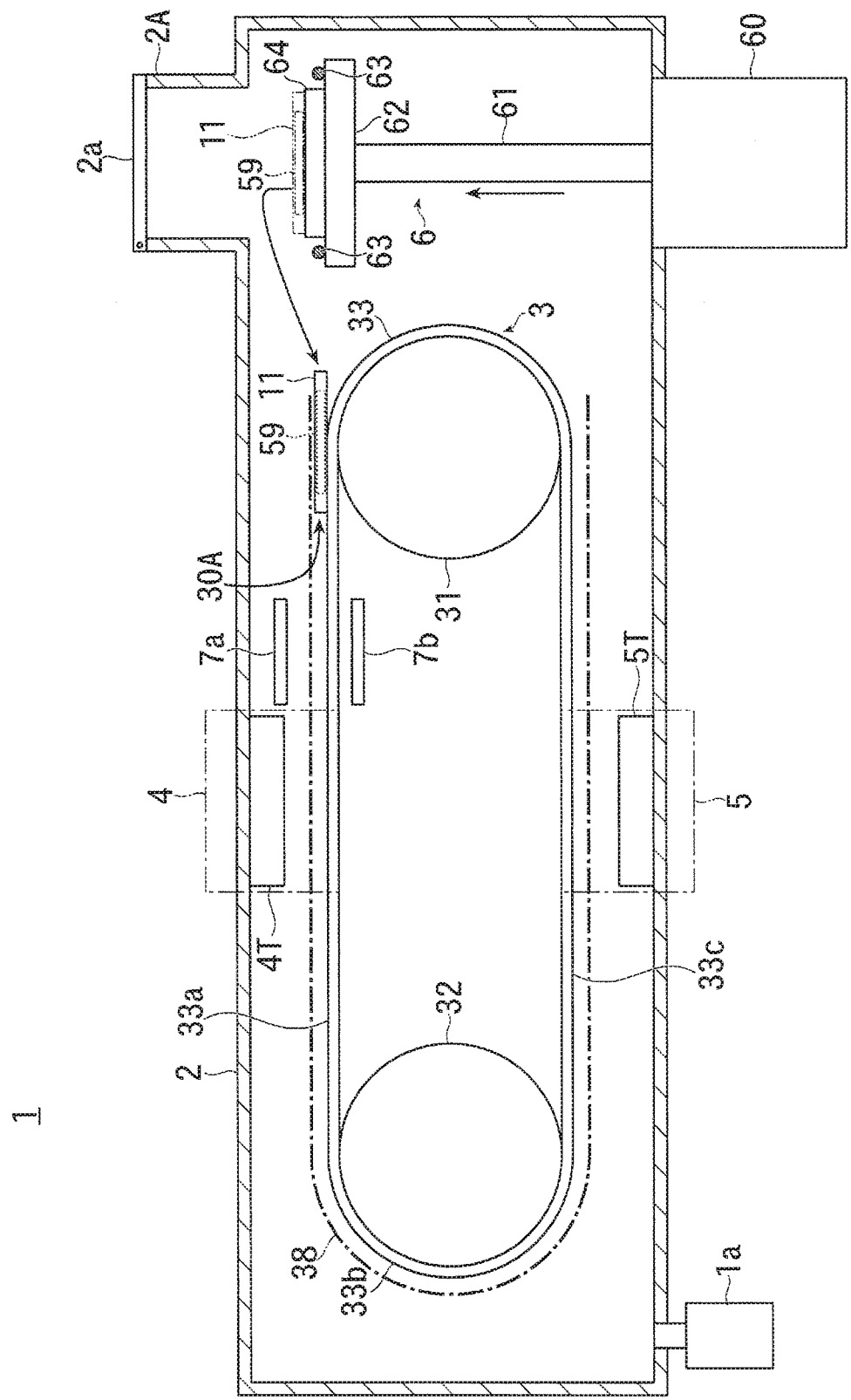
FIG. 18 is an explanatory diagram illustrating the operation for performing film formation on the substrate multiple times (part 2).
Figure 19:
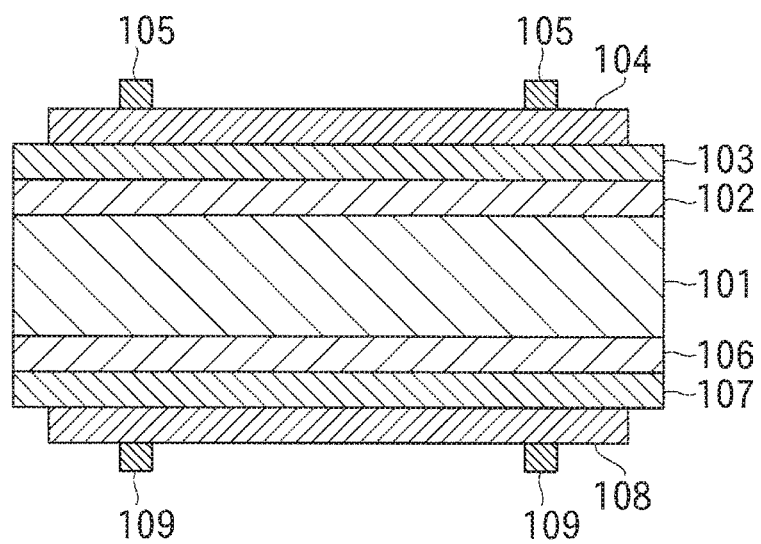
FIG. 19 is a cross-sectional view illustrating a general configuration of a typical heterojunction solar battery cell.

Thereafter, as illustrated in FIG. 18, the supporter 62 of the substrate carry-in and carry-out mechanism 6 is caused to ascend to the substrate-holder passing position and positioned so that the substrate holder 11 is at the same level as the forward path-side conveyance portion 33*a* of the conveyance drive member 33. The substrate holder 11 is then set at the substrate-holder introduction portion 30A of the substrate-holder conveyance mechanism 3 by the conveyance robot 64 on the supporter 62 of the substrate carry-in and carry-out mechanism 6.

Subsequently, a second film formation process on the film-formation target substrate 59 is performed by going through the above-described steps.

The film formation process on the substrate 59 can be performed three or more times by repeating the above-described operations and steps.

The present invention is applicable not only to the case where the substrate 50 before film formation is conveyed into the vacuum chamber 2 and the substrate 59 after film formation is carried out of the vacuum chamber 2, but also to the case where the substrate 50 before film formation is conveyed into the vacuum chamber 2 together with the substrate holder 11 and the substrate 59 after film formation is carried out of the vacuum chamber 2 together with the substrate holder 11.

REFERENCE SIGNS LIST

1 . . . film formation apparatus
2 . . . vacuum chamber
3 . . . substrate-holder conveyance mechanism
4 . . . first film formation region
4T . . . first sputtering source
5 . . . second film formation region
5T . . . second sputtering source
6 . . . substrate carry-in and carry-out mechanism
11 . . . substrate holder
13 . . . holder portion
14 . . . opening
15 . . . opening
16 . . . shield portion
30A . . . substrate-holder introduction portion
30B . . . turning conveyance portion
30C . . . substrate-holder ejection portion
33 . . . conveyance drive member
33a . . . forward path-side conveyance portion (first conveyance portion)
33b turning portion
33c . . . return path-side conveyance portion (second conveyance portion)
50 . . . film-formation target substrate
51 n-type crystalline silicon substrate
52 i-type amorphous silicon layer
53 p-type amorphous silicon layer
54 . . . first transparent conductive oxide layer
56 i-type amorphous silicon layer
57 n-type amorphous silicon layer
58 . . . second transparent conductive oxide layer
59 . . . substrate after film formation

The invention claimed is:

1. A film formation apparatus, comprising:
a vacuum chamber in which a single vacuum atmosphere is to be formed;
a first film formation region provided in the vacuum chamber, the first film formation region including a first sputtering source for performing film formation on a front surface of a film-formation target substrate;
a second film formation region provided in the vacuum chamber, the second film formation region including a second sputtering source for performing film formation on a back surface of the film-formation target substrate;
a conveyance path formed to have a single annular shape when projected onto a vertical plane, and provided to pass through the first and second film formation regions; and
a substrate-holder conveyance mechanism configured to convey, along the conveyance path, a substrate holder holding a film-formation target substrate in a horizontal position, wherein
the substrate-holder conveyance mechanism includes: a first conveyance portion configured to convey the substrate holder in a predetermined direction so that the substrate holder passes through the first film formation region; a second conveyance portion configured to convey the substrate holder in a direction opposite to the direction of conveyance by the first conveyance portion so that the substrate holder passes through the second film formation region; and a turning conveyance portion configured to convey the substrate holder from the first conveyance portion to the second conveyance portion in such a manner as to make a turn while maintaining an up/down orientation of the substrate holder, and
the substrate holder has openings through which the front and back surfaces of the film-formation target substrate are exposed, and includes a shield portion configured to shield an edge portion of the film-formation target substrate from a film formation material supplied from at least one of the first and second sputtering sources.

2. The film formation apparatus according to claim 1, wherein the substrate holder is configured to align a plurality of film-formation target substrates in a direction orthogonal to the conveyance direction and hold the film-formation target substrates.

3. A film formation method using a film formation apparatus, the film formation apparatus including: a vacuum chamber in which a single vacuum atmosphere is to be formed; a first film formation region provided in the vacuum chamber, the first film formation region including a first sputtering source for performing film formation on a front surface of a film-formation target substrate; a second film formation region provided in the vacuum chamber, the second film formation region including a second sputtering source for performing film formation on a back surface of the film-formation target substrate; a conveyance path formed to have a single annular shape when projected onto a vertical plane, and provided to pass through the first and second film formation regions; and a substrate-holder conveyance mechanism configured to convey, along the conveyance path, a substrate holder holding a film-formation target substrate in a horizontal position, wherein the substrate-holder conveyance mechanism includes: a first conveyance portion configured to convey the substrate holder in a predetermined direction so that the substrate holder passes through the first film formation region; a second conveyance portion configured to convey the substrate holder in a direction opposite to the direction of conveyance by the first conveyance portion so that the substrate holder passes through the second film formation region; and a turning conveyance portion configured to convey the substrate holder from the first conveyance portion to the second conveyance portion in such a manner as to make a turn while maintaining an up/down orientation of the substrate holder, and the substrate holder has openings through which the front and back surfaces of the film-formation target substrate are exposed, and includes a shield portion configured to shield an edge portion of the film-formation target substrate from a film formation material supplied from at least one of the first and second sputtering sources, the film formation method, comprising the steps of:
conveying the substrate holder by the first conveyance portion of the substrate-holder conveyance mechanism in a predetermined direction along the conveyance path so that the substrate holder passes through the first film formation region, and performing film formation by sputtering on the front surface of the film-formation target substrate held by the substrate holder;
conveying, by the turning conveyance portion of the substrate-holder conveyance mechanism, the substrate holder from the first conveyance portion to the second conveyance portion in such a manner as to make a turn along the conveyance path while maintaining the up/down orientation of the substrate holder; and
conveying, by the second conveyance portion of the substrate-holder conveyance mechanism, the substrate holder in the direction opposite to the direction of conveyance by the first conveyance portion along the conveyance path so that the substrate holder passes through the second film formation region, and performing film formation on the back surface of the film-formation target substrate held by the substrate holder.

4. A manufacturing method of a solar battery using a film formation apparatus, the film formation apparatus including: a vacuum chamber in which a single vacuum atmosphere is to be formed; a first film formation region provided in the vacuum chamber, the first film formation region including a first sputtering source for performing film formation on a front surface of a film-formation target substrate; a second film formation region provided in the vacuum chamber, the second film formation region including a second sputtering source for performing film formation on a back surface of the film-formation target substrate; a conveyance path formed to have a single annular shape when projected onto a vertical plane, and provided to pass through the first and second film formation regions; and a substrate-holder conveyance mechanism configured to convey, along the conveyance path, a substrate holder holding a film-formation target substrate in a horizontal position, wherein the substrate-holder conveyance mechanism includes: a first conveyance portion configured to convey the substrate holder in a predetermined direction so that the substrate holder passes through the first film formation region; a second conveyance portion configured to convey the substrate holder in a direction opposite to the direction of conveyance by the first conveyance portion so that the substrate holder passes through the second film formation region; and a turning conveyance portion configured to convey the substrate holder from the first conveyance portion to the second conveyance portion in such a manner as to make a turn while maintaining an up/down orientation of the substrate holder, and the substrate holder has openings through which the front and back surfaces of the film-formation target substrate are exposed, and includes a shield portion configured to shield an edge portion of the film-formation target substrate from a film formation material supplied from at least one of the first and second sputtering sources, the manufacturing method, comprising the steps of:

preparing, as the film-formation target substrate, a substrate composed of: an n-type crystalline silicon substrate; an i-type amorphous silicon layer and a p-type amorphous silicon layer stacked in this order over a front surface of the n-type crystalline silicon substrate; and an i-type amorphous silicon layer and an n-type amorphous silicon layer stacked in this order over a back surface of the n-type crystalline silicon substrate;

conveying the substrate holder by the first conveyance portion of the substrate-holder conveyance mechanism in a predetermined direction along the conveyance path so that the substrate holder passes through the first film formation region, and forming a first transparent conductive oxide layer by sputtering on the front surface of the film-formation target substrate held by the substrate holder;

conveying, by the turning conveyance portion of the substrate-holder conveyance mechanism, the substrate holder from the first conveyance portion to the second conveyance portion in such a manner as to make a turn along the conveyance path while maintaining the up/down orientation of the substrate holder; and conveying, by the second conveyance portion of the substrate-holder conveyance mechanism, the substrate holder in the direction opposite to the direction of conveyance by the first conveyance portion along the conveyance path so that the substrate holder passes through the second film formation region, and forming a second transparent conductive oxide layer by sputtering on the back surface of the film-formation target substrate held by the substrate holder.

* * * * *